(12) United States Patent
Avestruz et al.

(10) Patent No.: US 10,732,251 B2
(45) Date of Patent: Aug. 4, 2020

(54) WIRELESS POWER TRANSFER METERING

(71) Applicants: Al-Thaddeus Avestruz, Ann Arbor, MI (US); Spencer Haney, Ann Arbor, MI (US); Sung Yul Chu, Ann Arbor, MI (US)

(72) Inventors: Al-Thaddeus Avestruz, Ann Arbor, MI (US); Spencer Haney, Ann Arbor, MI (US); Sung Yul Chu, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 20 days.

(21) Appl. No.: 16/030,402

(22) Filed: Jul. 9, 2018

(65) Prior Publication Data
US 2019/0011523 A1 Jan. 10, 2019

Related U.S. Application Data

(60) Provisional application No. 62/529,830, filed on Jul. 7, 2017.

(51) Int. Cl.
*G01R 35/00* (2006.01)
*G01R 15/18* (2006.01)
*G01R 15/16* (2006.01)
*H02J 50/80* (2016.01)
*H02J 50/12* (2016.01)
(Continued)

(52) U.S. Cl.
CPC ......... *G01R 35/005* (2013.01); *G01R 15/142* (2013.01); *G01R 15/16* (2013.01); *G01R 15/18* (2013.01); *G01R 21/133* (2013.01); *H02J 50/12* (2016.02); *H02J 50/80* (2016.02); *G01R 21/002* (2013.01)

(58) Field of Classification Search
None
See application file for complete search history.

(56) References Cited

U.S. PATENT DOCUMENTS

2009/0067198 A1* 3/2009 Graham ............... H02J 7/025
  363/8
2012/0311356 A1* 12/2012 Tan .................... H02J 5/005
  713/310

(Continued)

OTHER PUBLICATIONS

"Wireless Power Transfer for Light-Duty Plug-In/Electric Vehicles and Alignment Methodology," ed: SAE International, 2016.

(Continued)

*Primary Examiner* — Jas A Sanghera
(74) *Attorney, Agent, or Firm* — Lempia Summerfield Katz LLC

(57) ABSTRACT

A system measures wireless power transfer between a transmitter and a receiver. The system includes a sensor circuit including a sensor. The sensor is configured and positioned to generate sensor data indicative of a field. The field is generated in connection with the wireless power transfer. The system further includes a processor coupled to the sensor circuit and configured to determine a power measurement based on the sensor data. The processor is further configured to determine misalignment of the transmitter or the receiver. The processor is also configured to correct an estimate of the power measurement based on the misalignment.

30 Claims, 25 Drawing Sheets

(51) Int. Cl.
*G01R 15/14* (2006.01)
*G01R 21/133* (2006.01)
*G01R 21/00* (2006.01)

(56) References Cited

U.S. PATENT DOCUMENTS

| | | | | |
|---|---|---|---|---|
| 2014/0001879 A1* | 1/2014 | Van Wageningen | ... | G01R 21/00 307/104 |
| 2014/0077616 A1* | 3/2014 | Baarman | ................ | H02J 5/005 307/104 |
| 2018/0138752 A1* | 5/2018 | Wilson | .................... | H02J 50/12 |

OTHER PUBLICATIONS

C. C. Mi, G. Buja, S. Y. Choi, and C. T. Rim, "Modem Advances in Wireless Power Transfer Systems for Roadway Powered Electric Vehicles," IEEE Transactions on Industrial Electronics, vol. 63, pp. 6533-6545, 2016.

D. R. Zimmanck and C. R. Sullivan, "Efficient calculation of winding-loss resistance matrices for magnetic components," in 2010 IEEE 12th Workshop on Control and Modeling for Power Electronics(COMPEL), 2010, pp. 1-5.

F. W. Grover, "The Calculation of the Mutual Inductance of Circular Filaments in Any Desired Positions," Proceedings of the IRE, vol. 32,pp. 620-629, 1944.

J. H. Spreen, "Electrical terminal representation of conductor loss intransformers," IEEE Transactions on Power Electronics, vol. 5, pp. 424-429, 1990.

S. Babic, F. Sirois, C. Akyel, and C. Girardi, "Mutual Inductance Calculation Between Circular Filaments Arbitrarily Positioned in Space: Alternative to Grovers Formula," IEEE Transactions on Magnetics, vol. 46, pp. 3591-3600, 2010.

S. Y. Chu and A. T. Avestruz, "Transfer-power measurement: A non-contact method for fair and accurate metering of wireless power transfer in electric vehicles," in 2017 IEEE 18th Workshop on Control and Modeling for Power Electronics (COMPEL), 2017, pp. 1-8.

Y. Gao, A. Ginart, K. B. Farley, and Z. T. H. Tse, "Misalignment effect on efficiency of wireless power transfer for electric vehicles," in 2016 IEEE Applied Power Electronics Conference and Exposition(APEC), 2016, pp. 3526-3528.

Y. Guo, J. Li, X. Hou, X. Lv, H. Liang, J. Zhou, et al., "Poyntingvector analysis for wireless power transfer between magnetically coupled coils with different loads," Scientific Reports, vol. 7, p. 741,Apr. 7, 2017 2017.

* cited by examiner

| Training sets/ Validation Sets | OPEN | SHORT | 8Ω | 10Ω | 16Ω | 25Ω | 33Ω | 50Ω | 100Ω |
|---|---|---|---|---|---|---|---|---|---|
| 8Ω | X | X |   | X | X | X | X | X | X |
| 10Ω | X | X | X |   | X | X | X | X | X |
| 16Ω | X | X | X | X |   | X | X | X | X |
| 25Ω | X | X | X | X | X |   | X | X | X |
| 33Ω | X | X | X | X | X | X |   | X | X |
| 50Ω | X | X | X | X | X | X | X |   | X |
| 100Ω | X | X | X | X | X | X | X | X |   |

FIG. 9

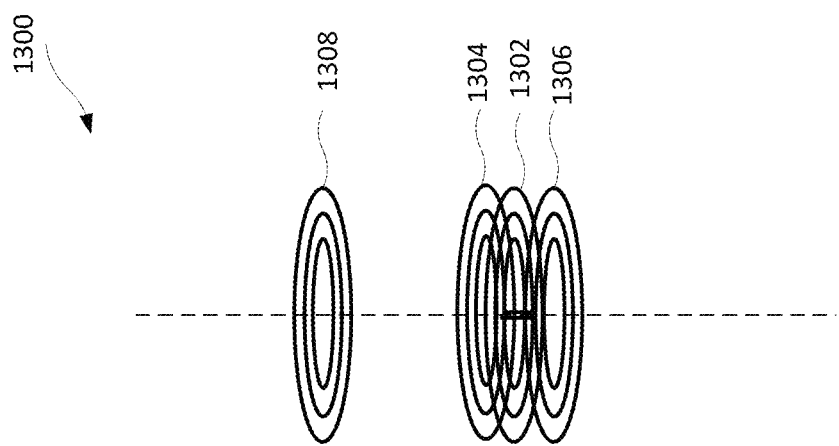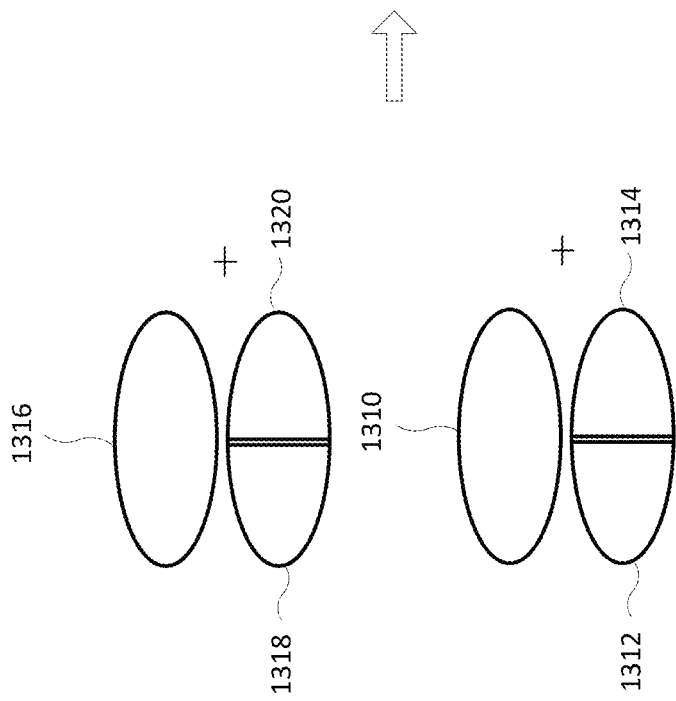
FIG. 13

WIRELESS POWER TRANSFER METERING

CROSS-REFERENCE TO RELATED APPLICATION

This application claims the benefit of U.S. provisional application entitled "Wireless Power Transfer Metering," filed Jul. 7, 2017, and assigned Ser. No. 62/529,830, the entire disclosure of which is hereby expressly incorporated by reference.

BACKGROUND OF THE DISCLOSURE

Field of the Disclosure

The disclosure relates generally to wireless power transfer.

Background

Utility-type meters have been used to measure power transferred to electric vehicles. Power is typically transferred to electric vehicles via plug-in arrangements. In such cases, a meter may be placed at the outlet of an electric vehicle charger to accurately measure the energy transferred to the vehicle.

Power has also been transferred wirelessly to electric vehicles. Wireless power transfer may increase both convenience, safety, and reliability. However, measuring the power transferred wirelessly is more complicated relative to plug-in arrangements.

SUMMARY OF THE DISCLOSURE

In accordance with one aspect, a system for measuring power transferred using wireless power transfer between a transmitter and a receiver includes a sensor circuit comprising a sensor, the sensor being configured and positioned to generate sensor data indicative of a field, the field generated in connection with the wireless power transfer, and a processor coupled to the sensor circuit and configured to determine a power measurement based on the sensor data.

In accordance with another aspect, a method of measuring wireless power transfer between a transmitter and a receiver includes capturing field data with a sensor configured and positioned to generate sensor data indicative of a field, the field generated in connection with the wireless power transfer; and determining a power measurement based on the field data.

In accordance with yet another aspect, a method of calibrating a wireless power transfer measurement device includes positioning a test receiver relative to a transmitter and the wireless power transfer measurement device, capturing field data for a load impedance with the wireless power transfer measurement device, determining a power measurement based on the field data, and determining a plurality of calibration factors for the wireless power transfer measurement device based on the power measurement.

In connection with any one of the aforementioned aspects, the system or method may alternatively or additionally include any combination of one or more of the following aspects or features. The sensor is positioned between the transmitter and the receiver. The sensor circuit includes a plurality of sensors configured and positioned to generate sensor data indicative of the field, the plurality of sensors comprising the sensor. The processor is configured to determine the power measurement using pair-wise products of the plurality of sensors. Each sensor of the plurality of sensors includes a respective capacitive sense plate such that the field is an electric field. The sensor includes a sense coil. The field includes a magnetic field. The processor is further configured to determine a misalignment of the transmitter or the receiver, and to correct an estimate of the power measurement based on the misalignment. The power measurement is indicative of real power. The processor is configured to determine the power measurement via frequency domain computations. The processor is configured to determine the power measurement via binning in the frequency domain. The processor is configured to determine the power measurement via time domain computations. The sensor is a first sensor of the sensor circuit, the sensor circuit includes a second sensor spaced from the first sensor, and the first and second sensors are configured and spaced from the transmitter and the receiver to generate the sensor data. The first and second sensors include respective capacitive sense plates such that the field is an electric field. The method further includes positioning the sensor between the transmitter and the receiver. Determining the power measurement includes determining a misalignment of the transmitter or the receiver. Determining the power measurement further includes correcting the power measurement based on the alignment. Determining the power measurement includes frequency domain processing. Determining the power measurement includes binning in the frequency domain. The field data includes magnetic field data. Capturing the field data includes varying a load impedance of the test receiver. Capturing the field data includes varying a load resistance of the test receiver. Determining the plurality of calibration factors includes performing an optimization to minimize measurement error. The method further includes measuring load voltage and load current in the test receiver. Determining the plurality of calibration factors includes performing a least squares approximation.

BRIEF DESCRIPTION OF THE DRAWING FIGURES

For a more complete understanding of the disclosure, reference should be made to the following detailed description and accompanying drawing figures, in which like reference numerals identify like elements in the figures.

FIG. 9 is a table illustrating a validation method for transfer power measurement in accordance with one example.

FIG. 13 shows schematic depictions of another sense coil arrangement configured to provide misalignment information in accordance with one example.

Figure 1:
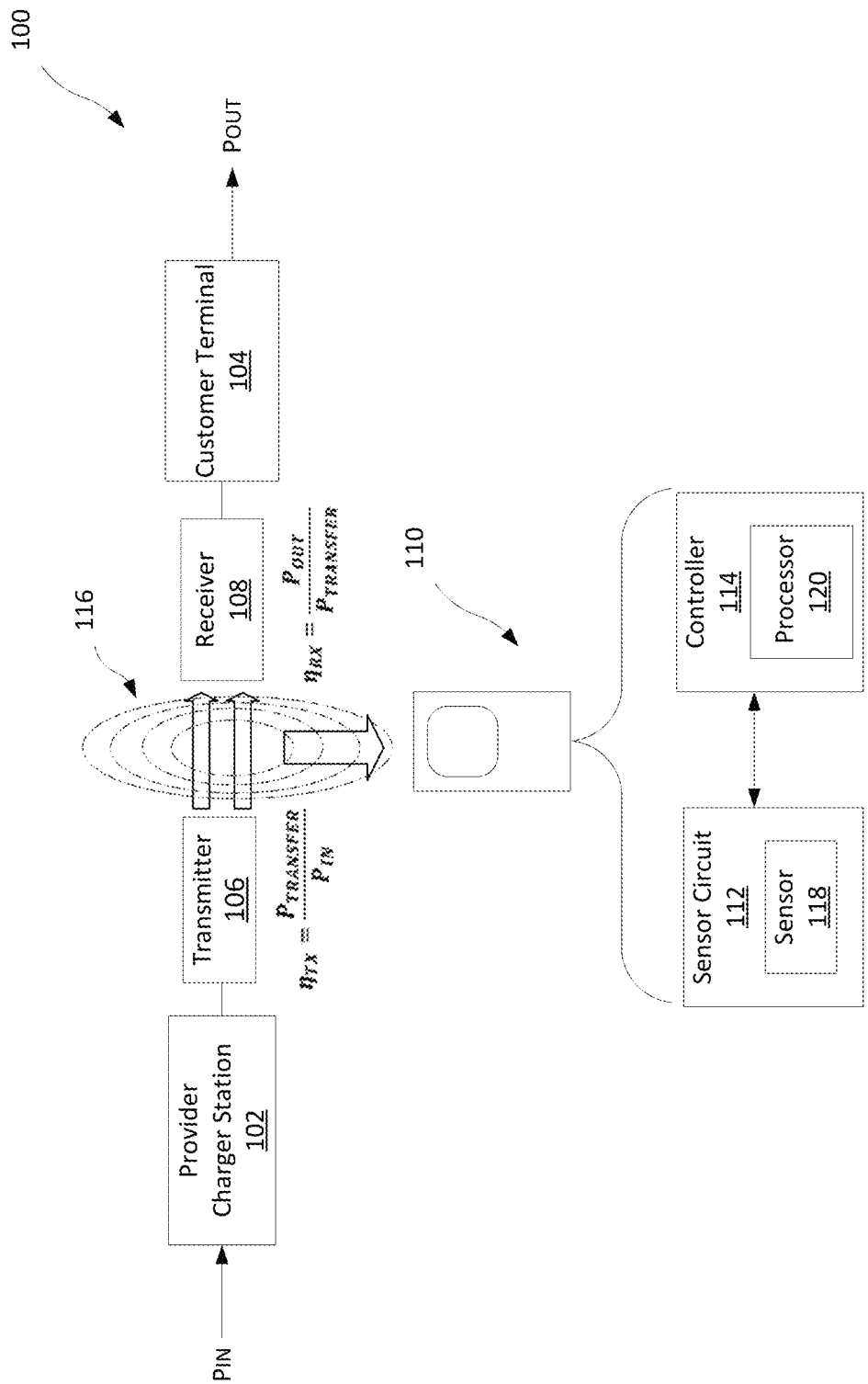
FIG. 1 is a block diagram of a transfer power measurement system disposed in a wireless power transfer arrangement and configured in accordance with one example.

The disclosed systems and methods are susceptible of embodiments in various forms. Specific embodiments are illustrated in the drawing and will hereafter be described with the understanding that the disclosure is intended to be illustrative. The disclosure is not intended to limit the invention to the specific embodiments described and illustrated herein.

DETAILED DESCRIPTION

Systems and methods for metering of wireless power transfer are disclosed. The systems and methods may measure the real power propagating through space (e.g., the real power exchanged between a transmitter coil and a receiver coil). The wireless power transfer metering systems and methods thus measure the transfer power rather than the voltage and current at a transmitter or at a receiver. Measuring the transfer power allows the systems and methods to exclude losses from either side. The transfer power is measured by the disclosed systems and methods without distorting, interrupting, or otherwise adversely affecting the field between the transmitter and the receiver.

In some cases, the transfer power is monitored in or through the gap between the transmitter and receiver. The transfer power measurement methods and systems disclosed herein may quantify the transfer power by sensing a field (e.g., electric field, magnetic field, or electromagnetic field) between the transmitter and the receiver. The sensed field is then used to determine the power transferred.

Metering in accordance with the disclosed systems and methods provides a fair and accurate solution because the disclosed metering disaggregates individual transmitter and receiver efficiencies. Power measurement directly from voltage and current at the transmitter or receiver electrical terminals is inequitable because there is no way to individually attribute losses to either side because a number of losses, including those from wireless power transfer coils and power electronics, are aggregated. Terminal power measurement from either side imposes the costs caused by losses to either actor unilaterally. If power is measured at the provider terminal, metering includes transmitter losses, which ought to have been excluded in pricing and thus constitutes an overcharge to customers. Likewise, metering at the customer terminal does not account for receiver losses and hence represents an undercharge. These inequities are exacerbated in systems with low efficiency, with a potential for abuse when there is access to measurement terminals.

In contrast, the disclosed metering wireless power transfer systems and methods are useful in several respects, including without limitation: accuracy with transmitter and receiver losses individually articulated; insensitivity to incidental electrical and physical parameters; broad applicability to a variety of mixed loads with components that may be reactive and nonlinear (e.g., rectifiers); and, fast, convenient, and automated calibration. A target accuracy for wireless power transfer metering is better than 0.1%. Towards this, independence from self-inductance of the transmitter and the receiver coils is assured and losses from the core, windings, and power electronics along with non-linearities accounted, while sensitivity to physical misalignment is mitigated and minimized. As a notable observation, large misalignments are disincentivized by visual feedback of excessive cost per kWh from very low charging efficiency, resulting in either the operator locking out or the customer improving vehicle positioning.

The disclosed systems and methods use a framework for transfer power measurement in which one or more sensing elements are used to measure, with minimal disturbance, the magnetic field from wireless power transfer through, e.g., induced voltages. The measurement may be considered to be deduced from the measurement of power through the Poynting vector ($\vec{S} = \vec{E} \times \vec{H}$ [W/m$^2$]). The power measurement provided by the disclosed methods and systems may be indicative of real power or other power or energy quantifications, including, for instance, reactive power, apparent power, power efficiency, the energy transferred from transmitter to receiver, and/or energy efficiency.

The transfer power measurement systems and methods may include or involve aspects of metering from an arbitration perspective, such as calibration and inspection. In some cases, the transfer power measurement may provide fair metering for wireless power transfer through calibration and inspection implemented by, for instance, a government agency. Examples of calibration methods and other techniques for calibrating the disclosed measurement systems are described below.

The disclosed methods and systems may account for misalignment. Misalignment refers to performing a measurement with a position for the transmitter, receiver, and/or sensor that is different than the positions for the transmitter, receiver, or sensor used in calibration. Position misalignment may occur in any of the three-dimensional axes. Misalignment may also include an angular deviation for the transmitter, receiver, or sensors that are different from calibration. Transfer power metering on a fixed position between the transmitter and the receiver would otherwise not account for lateral and other misalignments, which are common in practice. However, misalignment may be addressed by using more sensors (e.g., sense coils). The multiple sensors provide information about the misalignment. The disclosed systems and methods may thus measure under misalignment using multiple sensors (e.g., sense coils). A quadratic approximation of coupling coefficients under misalignment may then be used to correct the errors.

The wireless power transfer may be in connection with electric vehicles. The disclosed methods and systems disaggregate the losses in the wireless power transfer. The cost for lost energy may thus be appropriately assigned among the stakeholders. Each actor may thus be informed of the costs. Each actor is thereby motivated to behave appropriately, including investing in technology to alleviate the loss.

Although described in connection with electric vehicles, the disclosed systems are not limited to wireless power transfer involving electric vehicle charging. Power may be wirelessly transferred to a variety of other loads. The nature of the load, power, source, and other characteristics of the environment in which the power transfer occurs may vary considerably from the examples described herein.

FIG. 1 depicts a wireless power transfer arrangement or system 100 configured in accordance with one example. The wireless power transfer arrangement 100 includes a provider charger station 102 and a customer terminal 104. A transmitter 106 of the station 102 provides power to a receiver 108 at the customer terminal 104. Power wirelessly transferred by the transmitter 106 to the receiver 108 is measured by a system 110 configured in accordance with one example. The type, configuration, and other characteristics of the transmitter 106 and the receiver 108 may vary. For instance, the transmitter 106 may be an induction power transmitter, a radio frequency power transmitter, or other power transmitter.

The system 110 includes a sensor circuit 112 and a controller 114. The sensor circuit 112 may be configured to generate sensor data indicative of a field 116 generated by the transmitter 106 and by the receiver 108. In the example of FIG. 1, the sensor circuit 112 includes a sensor 118. Any number of sensors may be provided or included. In some cases, the sensor 118 may be positioned between the transmitter 106 and the receiver 108. The sensor 118 is configured to capture the data of the field 116.

The field 116 may be or include a magnetic field and/or an electric field. The field 116 is produced by the transmitter 106 from power $P_{IN}$ made available to the provider charger station 102. The field 116 may be or include a time varying field capable of wirelessly transferring power by inducing or otherwise generating a voltage or a current in the receiver 108. Once the field 116 is captured at the receiver 108, power ($P_{OUT}$) is then provided to a load, such as a battery of a vehicle, via the customer terminal 104.

The controller 114 includes a processor 120, such as a signal processor. The processor 120 may be coupled to the sensor circuit 112. The processor 120 may be configured to determine a power measurement based on the data of the sensor 118. The processor 120 may be further configured to determine the power measurement via frequency domain computations. The processor 120 may be configured to determine a misalignment of the transmitter 106 and/or the receiver 108. The processor 120 may be additionally configured to correct an estimate of the power measurement based on the misalignment of the transmitter 106 or the receiver 108. Further details regarding these determinations are provided herein below.

The controller 114 may include one or more processors, such as, a central processing unit (CPU). The controller 114 may thus include multiple controllers or processors for respectively controlling, directing, or otherwise communicating with one or more of the above-described system components (e.g., the sensor(s)).

The processor 120 of the controller 114 may be a component in a variety of systems. The processor 120 may be one or more general processors, digital signal processors, application specific integrated circuits, field programmable gate arrays, networks, digital circuits, analog circuits, combinations thereof, or other now known or later developed devices for analyzing and processing data. The processor may implement a software program, such as code generated manually (i.e., programmed).

The controller 114 may include one or more memories or storage units. The memory may communicate via a bus. The memory may be a main memory, a static memory, or a dynamic memory. The memory may include, but may not be limited to computer readable storage media such as various types of volatile and non-volatile storage media, including but not limited to random access memory, read-only memory, programmable read-only memory, electrically programmable read-only memory, electrically erasable read-only memory, flash memory, and the like. In one case, the memory may include a cache or random access memory for the processor. Alternatively or additionally, the memory may be separate from the processor, such as a cache memory of a processor, the system memory, or other memory. The memory may be an external storage device or database for storing data. Examples may include a hard drive, memory card, memory stick, or any other device operative to store data. The memory may be operable to store instructions executable by the processor. The functions, acts or tasks illustrated in the figures or described herein may be performed by the programmed processor executing the instructions stored in the memory. The functions, acts or tasks may be independent of the particular type of instruction set, storage media, processor or processing strategy and may be performed by software, hardware, integrated circuits, firmware, micro-code and the like, operating alone or in combination. Likewise, processing strategies may include multiprocessing, multitasking, parallel processing and the like.

Alternatively or additionally, dedicated hardware implementations, such as application specific integrated circuits, programmable logic arrays and other hardware devices, may be constructed to implement one or more of the methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system may encompass software, firmware, and hardware implementations.

Figure 2:
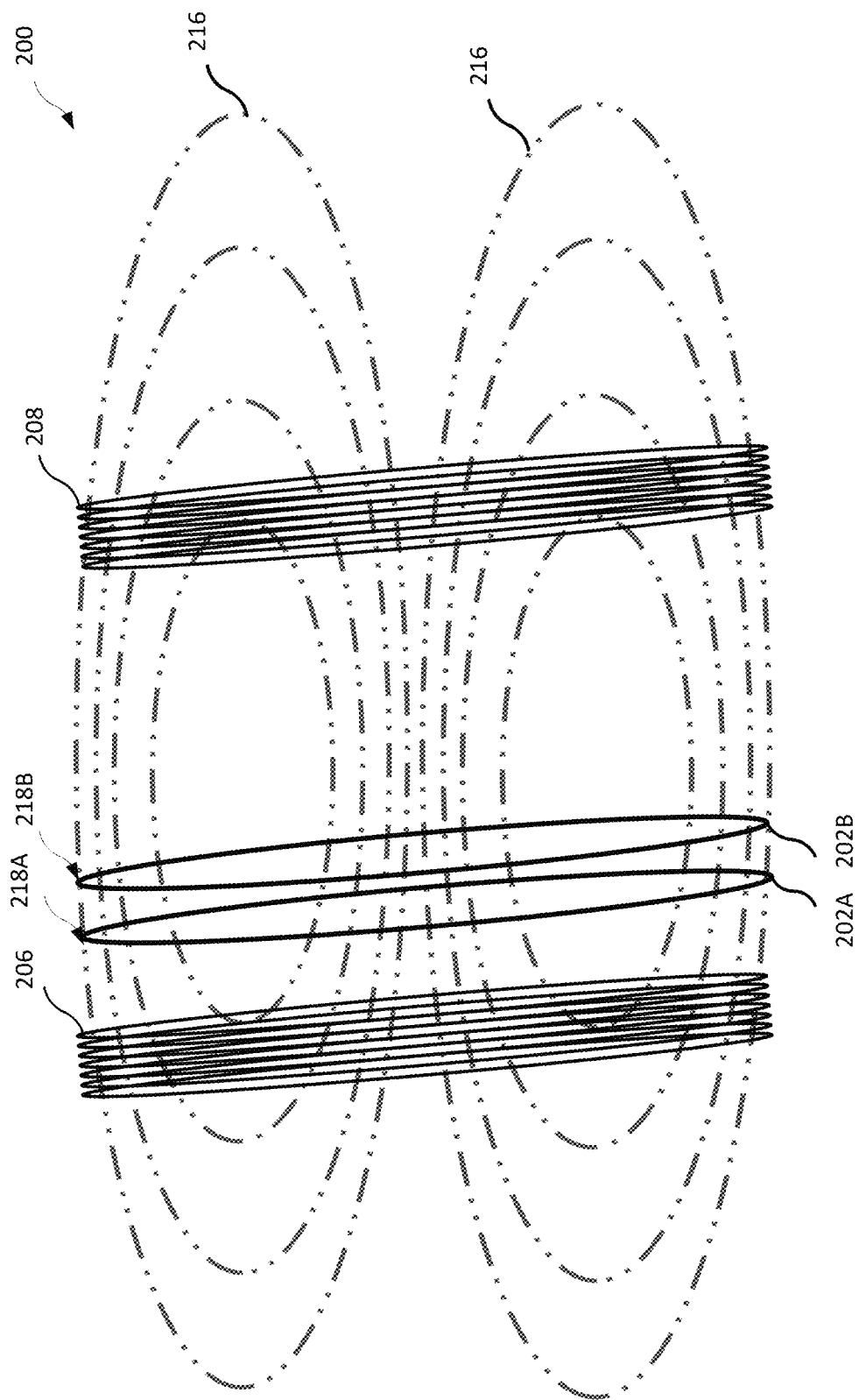
FIG. 2 is a schematic depiction of sense coils of a transfer power measurement system in accordance with one example.
Figure 3:
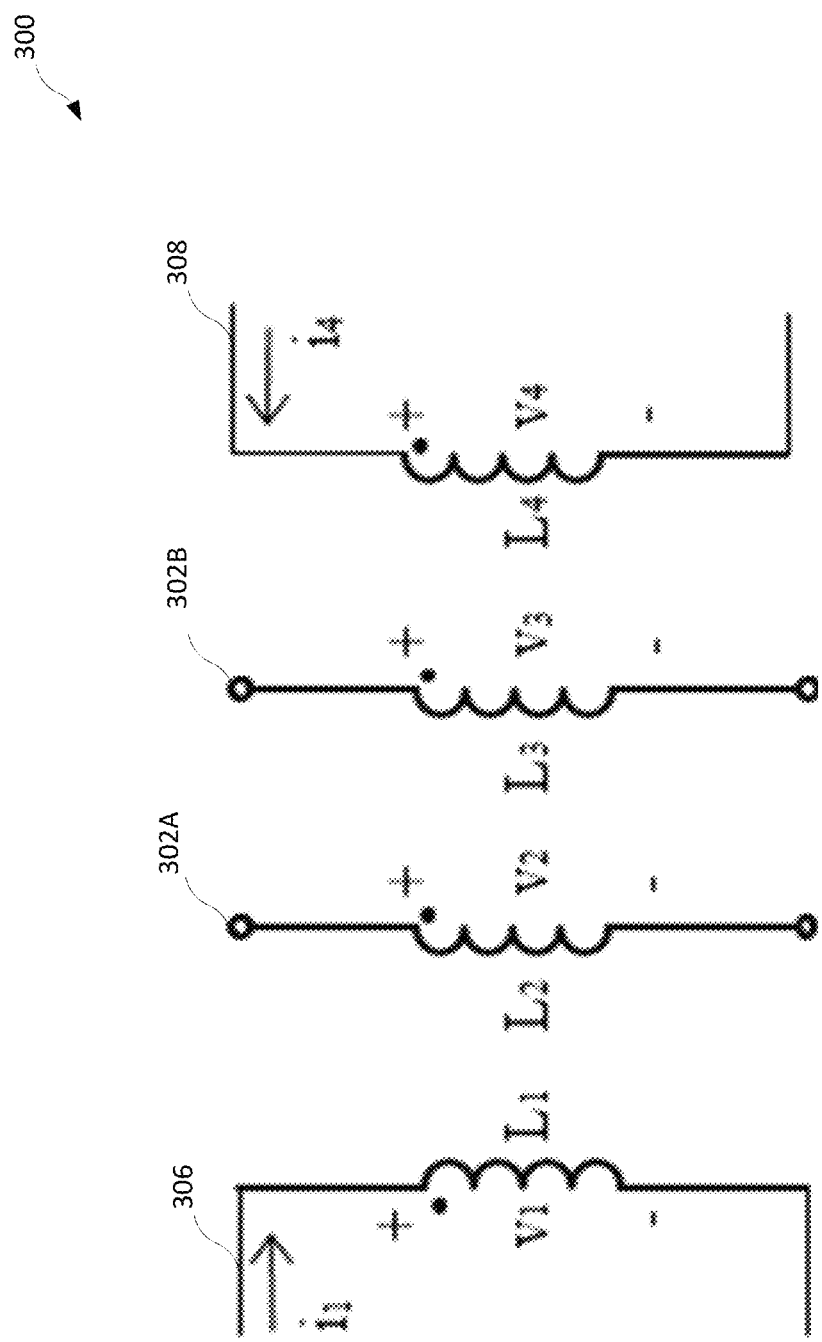
FIG. 3 is a circuit diagram depicting sense coils of a transfer power measurement system in accordance with one example.

Transfer power may be estimated by sense coils or other sensors placed between the transmitter and the receiver. In some cases, two sense coils are used to estimate transfer-power. FIGS. 2 and 3 depict a magnetically coupled circuit with two sense coils in accordance with one example.

FIG. 2 depicts a schematic representation of a sensor circuit 200 configured to be magnetically coupled in accordance with one example. The sensor circuit 200 may be used in the system 110 of FIG. 1. In this example, the sensor circuit 200 includes a sensor 218A disposed between a transmitter 206 and a receiver 208. The sensor 218A may be a first sensor of a plurality of sensors of the sensor circuit 200. In this example, the sensor circuit 200 further includes a second sensor 218B spaced from the first sensor 218A. The first sensor 218A and the second sensor 218B are disposed between the transmitter 206 and the receiver 208. The first sensor 218A and the second sensor 218B are configured to generate the sensor data indicative of a field 216. In this example, the sensors 218A, 218B include sense coils 202A, 202B, respectively. In other cases, a sensor may include multiple coils.

FIG. 3 depicts a circuit diagram representation of a sensor circuit 300 in accordance with one example. The sensor circuit 300 may correspond with the sensor circuit 200. In this case, the sensor circuit 300 includes two sense coils 302A, 302B disposed between a transmitter 306 and a receiver 308. A voltage and/or current sensor may be attached to the sense coils 302A, 302B.

The sense coils 302A, 302B or other sensors may be disposed in other positions. For instance, the sense coils or other sensors may be disposed below the transmitter 306, above the receiver 308, or adjacent to one of the transmitter 306 and the receiver 308.

Magnetically-coupled wireless power transfer may be analyzed as a transformer in the frequency domain by the processor 114 (FIG. 1). By employing multiple sense coils, such as the two sense coils 302A and 302B of FIG. 3, the voltages and currents at the transmitter 306 and the receiver 308 are representable as linear combinations of sense coil voltages as shown in equation (2). Referring to FIG. 3, $(v_1, i_1)$ and $(v_4, i_4)$ are the voltages and currents of the transmitter 306 and the receiver 308, respectively; $v_2$ and $v_3$ are the voltages of sense coil 302A and 302B. The transformer equations are expressed in equation (1), where sense coil currents are zero and $M_{ij}$ is the mutual inductance between coil i and j with frequency domain representations $V_i$ and $I_i$ from the Fourier transform.

$$I_2 = I_1 = 0$$

$$V_1 = j\omega L_1 I_1 + j\omega M_{14} I_4$$

$$V_2 = j\omega M_{12} I_1 + j\omega M_{24} I_4 \quad (1)$$

$$V_3 = j\omega M_{13} I_1 + j\omega M_{34} I_4$$

$$V_4 = j\omega M_{14} I_1 + j\omega L_4 I_d$$

From equation (1), the voltages and currents $(V_1, I_1)$ and $(V_4, I_4)$ may be derived in equation (2) from $V_2$ and $V_3$ scaled by coupling coefficients $$k_{ij} = \frac{M_{ij}}{\sqrt{L_i L_j}}$$

and the self-inductances $L_i$ of each coil.

$$\begin{pmatrix} V_1 \\ I_1 \end{pmatrix} = \begin{pmatrix} \frac{\sqrt{L_1}}{\sqrt{L_2}} \left( \frac{k_{13}k_{14} - k_{34}}{k_{13}k_{24} - k_{12}k_{34}} \right) & \frac{\sqrt{L_1}}{\sqrt{L_3}} \left( \frac{k_{24} - k_{14}k_{12}}{k_{13}k_{24} - k_{12}k_{34}} \right) \\ -\frac{j}{\omega} \frac{k_{34}}{\sqrt{L_1 L_2}(k_{12}k_{34} - k_{13}k_{24})} & \frac{j}{\omega} \frac{k_{24}}{\sqrt{L_1 L_3}(k_{12}k_{34} - k_{13}k_{24})} \end{pmatrix} \begin{pmatrix} V_2 \\ V_3 \end{pmatrix}, \quad (2)$$

$$\begin{pmatrix} V_4 \\ I_4 \end{pmatrix} = \begin{pmatrix} \frac{\sqrt{L_4}}{\sqrt{L_2}} \left( \frac{k_{13} - k_{14}k_{34}}{k_{13}k_{24} - k_{12}k_{34}} \right) & \frac{\sqrt{L_4}}{\sqrt{L_3}} \left( \frac{k_{14}k_{24} - k_{12}}{k_{13}k_{24} - k_{12}k_{34}} \right) \\ -\frac{j}{\omega} \frac{k_{13}}{\sqrt{L_2 L_4}(k_{13}k_{24} - k_{12}k_{34})} & \frac{j}{\omega} \frac{k_{12}}{\sqrt{L_3 L_4}(k_{13}k_{24} - k_{12}k_{34})} \end{pmatrix} \begin{pmatrix} V_2 \\ V_3 \end{pmatrix}$$

or $$\begin{pmatrix} V_4 \\ I_4 \end{pmatrix} = \begin{pmatrix} A & B \\ C & D \end{pmatrix} \begin{pmatrix} V_2 \\ V_3 \end{pmatrix} \quad (2)$$

or in general terms, $$\begin{pmatrix} V_R \\ I_R \end{pmatrix} = \begin{pmatrix} A(L_1, k) & B(L_2, k) \\ \frac{1}{j\omega} C(L_1, k) & \frac{1}{j\omega} D(L_2, k) \end{pmatrix} \begin{pmatrix} V_2 \\ V_3 \end{pmatrix} \quad (2)$$

where $V_k, I_k \in \pounds, L_k = (L_R, L_k), \quad k = (k_{TR}, k_{Ti}, k_{Ri})$ $k_{Ti}, k_{Ri}$: Coupling coefficients of Tx, Rx to all sense coils.

In equation (2), A, B, C, D are functions of magnetic and geometric parameters that correspond to coupling coefficients and self-inductance. $k_{ij}$ represents the coupling coefficient between coil i and j. Therefore, $V_4$ and $I_4$ (or in general terms, $V_R$ and $I_R$ respectively) are estimated from $V_2$, $V_3$ and A, B, C, D. From equation (2), transfer-power can be derived as shown in equation (3) below.

Complex power may be calculated by multiplying the voltage with the complex conjugate of current at every frequency from which real power in the frequency domain $P(\omega)$ may be obtained. The calculation of real power is homomorphic for $(V_1, I_1)$ and $(V_4, I_4)$ as shown in equation (3).

$$P(\omega) = \quad (3)$$

$$\mathrm{Re}(V_1 I_1^*) = \mathrm{Re}(V_4(-I_4^*)) = \frac{\mathrm{Im}(V_2^* V_3)}{\omega} \frac{1}{\sqrt{L_2 L_3}} \frac{k_{14}}{k_{13}k_{24} - k_{12}k_{34}}$$

Figure 4:
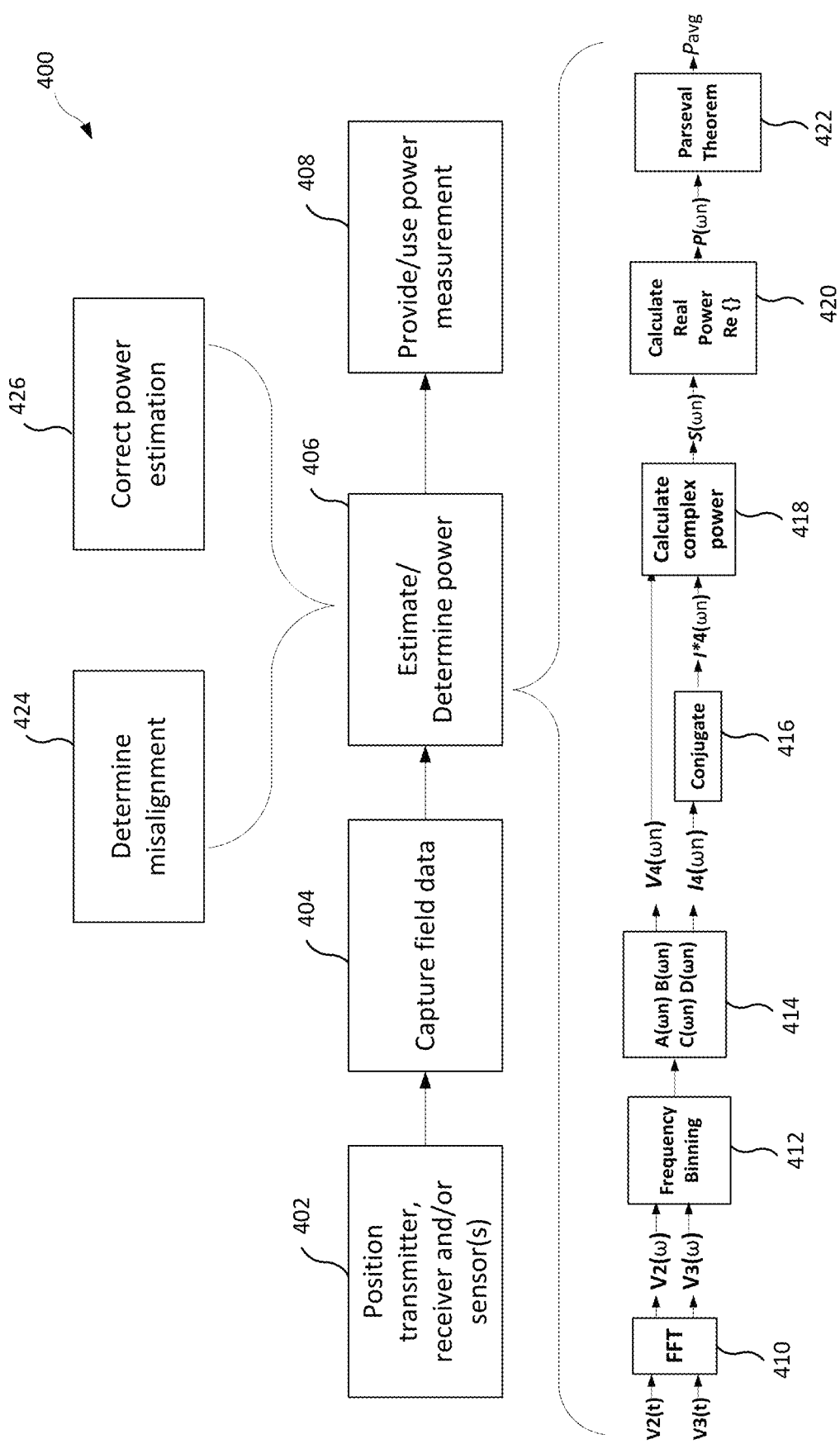
FIG. 4 is a flow diagram of a power estimation method for transfer power measurement in accordance with one example.

This is consequential because even though the power estimation and calibration (delineated in a subsequent section) is from the perspective of the vehicle $(V_4, I_4)$, it is equivalently calculated by $(V_1, I_1)$, which may be regarded as considerably more reliable because together, the transmitter and sense coils are immobile, hence fixing $k_{12}$ and $k_{13}$. One may then conclude that sense coils ought to be placed closer to the transmitter coil to maximize $k_{12}$ and $k_{13}$ so that the power calculation will be less sensitive to the position of the receiver coil as shown in FIG. 4. This minimizes the sensitivity of the power estimation to misalignments because changes of $k_{14}$ will be accompanied by changes in $k_{24}$ and $k_{34}$. Moreover, in deriving equation (3), the self-inductances of the transmitter ($L_1$) and the receiver ($L_4$) individually cancel to make the power estimation independent of these parameters. Only sense coil inductances $L_2$ and $L_3$ matter, which are unaltered after calibration. From P(ω), time-domain average power may be calculated through Parseval's theorem in equation (4): total energy and power in the time domain is equal to that in the frequency domain.

$$P_{avg} = \frac{1}{N}\left(\frac{1}{N}\sum_{k=0}^{N-1}|P[\omega]|^2\right) \quad (4)$$

There are several ways in which processing in the frequency domain is useful. These include accounting for frequency-dependent losses and nonlinearities through the integer harmonics of the fundamental. The prior knowledge that nonlinearities result in integer harmonics allows for accurate frequency estimation, which is useful for the accurate estimation of power in equation (2). Estimating the fundamental frequency is the easiest because it is the largest in amplitude; from this, all other harmonic frequencies may be deduced.

FIG. 4 depicts a method 400 of measuring wireless power transfer between a transmitter and a receiver. The method 400 may be implemented by a processor, such as a signal processor, configured for estimating the power transferred between a transmitter and a receiver. The configuration and other characteristics of the transmitter and the receiver may vary considerably. The field generated by the transmitter may also vary. For instance, the field may be a magnetic field or an electric field. The method 400 may be implemented by one of the above-described systems or another system. For instance, the method 400 may be implemented by the processor 114 of the system 110 of FIG. 1.

The method 400 may include act 402 in which a transmitter, a receiver and one or more sensors are positioned. The positioning of the sensor(s) may vary. The sensor(s) may or may not be positioned between the transmitter and the receiver. For instance, in some cases, one or more sensors may be positioned behind the transmitter or the receiver. In some other cases, one or more sensors may be positioned adjacent to the transmitter or the receiver.

In act 404, the sensors are configured to sample or otherwise capture the field data. The field data may comprise magnetic field data or electric field data or both. The sensors may generate sensor data indicative of the field. Each sensor may be a coil as described herein. Other types of sensors may be used, including, for instance, conductive plates or other conductive structures to sense an electric field.

In act 406, a power measurement is estimated or determined based on the field data. In the example depicted in FIG. 4, two sense coils were used in the act 404 as sensors to generate the filed data used to measure or estimate the power. In FIG. 4, v2(t) and v3(t) represent the voltages in the time domain of the first sense coil and the second sense coil, respectively.

The power measurement determination may include frequency domain processing. For example, a fundamental component harmonic may be used, which may be useful because the fundamental component harmonic is the largest in amplitude. The fundamental harmonic may be predetermined or otherwise known. The fundamental component harmonic is also the most reliable data because the fundamental component harmonic has the largest signal to noise ratio (SNR), and SNR is increasing with higher order of harmonics, which disturbs correct estimation. From this fundamental estimation, all other harmonics frequencies may be deduced via binning, examples of which are described below.

The disclosed methods may thus truncate frequency component harmonics without cost, while providing fast and efficient data processing. Moreover, errors due to this truncation may be estimated because the worst case of truncation error may be regarded as the case of square wave harmonics, which amplitudes fall off by ratio of 1/f. Moreover, the power measurement determination of the act 406 may include an act 410 in which the fast Fourier transform (FFT) is used. The FFT provides efficient, fast processing, which may be implemented via hardware. In contrast, in time-domain analysis, all data points are kept, and it is also difficult to consider phase-shift correctly.

Figure 5:
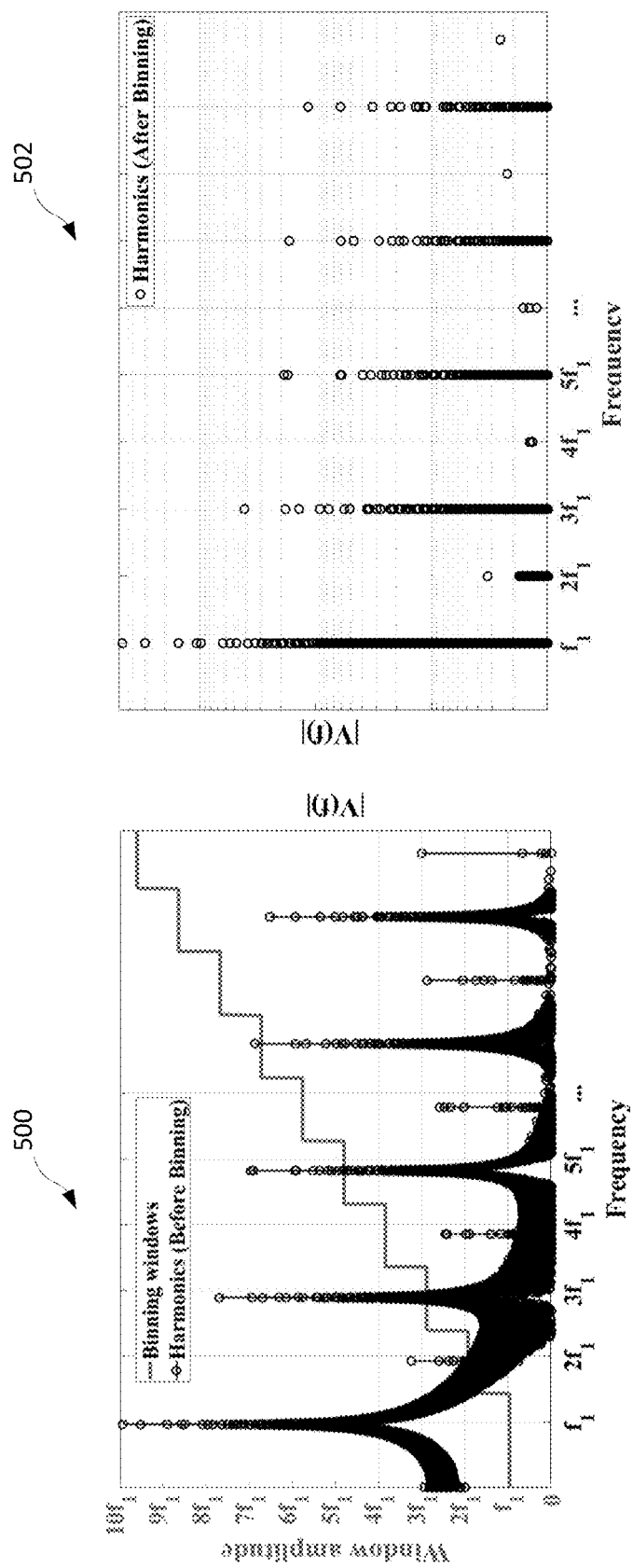
FIG. 5 are plots of an example of a binning act of a power estimation method in accordance with one example.

In the example of FIG. 4, the act 406 also includes an act 412, in which binning in the frequency domain is implemented. Binning may be used to estimate and calculate frequency harmonics. An example of binning is shown in FIG. 5, where plots 500 show the frequency harmonics before binning, and plots 502 show the frequency harmonics after binning. Gathering the frequency spread $V_2(\omega)$ and $V_3(\omega)$ from the Fast-Fourier Transform (FFT) into integer harmonic bins results in a more accurate power estimation. There is spectral leakage around integer harmonics. Therefore, the binning may be matched to one representative frequency under the binning window, as illustrated in FIG. 5. However, it can be confounded by too much spectral leakage (which occurs when the sampling frequency is no integer multiple of the fundamental) among FFT bins. Because the FFT bins are spaced by the ratio of sampling frequency to the number of data points, frequency estimation errors may be alleviated selection of sampling frequency and sampling duration in combination with zero padding, which is the equivalent of interpolation.

The number of data points and measurement time (e.g., period) may be set to facilitate accurate measurement. Frequency resolution is established by the number of data points. A large number of data points yields a high resolution in the frequency domain. Duration (time), or how many periods are measured is relevant in the sense that frequency estimation error decreases as the duration increases.

The sampling frequency may also be selected to facilitate accurate measurement. Based on the sampling frequency, the magnitude of aliased frequency components, which is reflected backward from fs, is determined. As fs decreases, the distortion from aliasing becomes larger if there are many harmonics. For a fixed data points, increased duration causes lower sampling frequency. For a fixed sampling frequency, increased duration causes increased data points, N.

Frequency estimation may also be used to obtain accurate power estimates. For instance, prior knowledge that all periodic signals have integer harmonics of the fundamental frequency may be used. The fundamental frequency has the largest signal, so frequency estimation may be easier. All other harmonics typically have much smaller amplitudes. The fundamental frequency may give the best frequency estimate, which may then be used for the higher harmonics.

The act 406 may also include an act 414, in which the receiver voltage $V_4(\omega_n)$ and the receiver current $I_4(\omega_n)$ are derived. From those derivations, the complex conjugate of the current $I_4$ at every frequency is obtained in an act 416. In an act 418, the complex power may be calculated by multiplying the voltage $V_4(\omega_n)$ with the complex conjugate of current $I_4(\omega_n)$ at every frequency from which real power in the frequency domain may be obtained. In an act 420, real power $P(\omega)$ is calculated. In an act 422, the real power $P(\omega)$ is used to calculate the time-domain average power $P_{avg}$ through Parseval's theorem.

In some cases, the power measurement determination also includes an act 424, in which a misalignment of the transmitter or the receiver is determined, and an act 426, in which the power estimation is corrected based on the alignment. Further details regarding examples of the misalignment determination and correction are provided below.

The disclosed methods and systems may include or involve calibration of the transfer power measurement. For instance, the transfer power measurement systems may be calibrated in accordance with a calibration method and/or another aspect of the disclosed power measurement methods.

Figure 6:
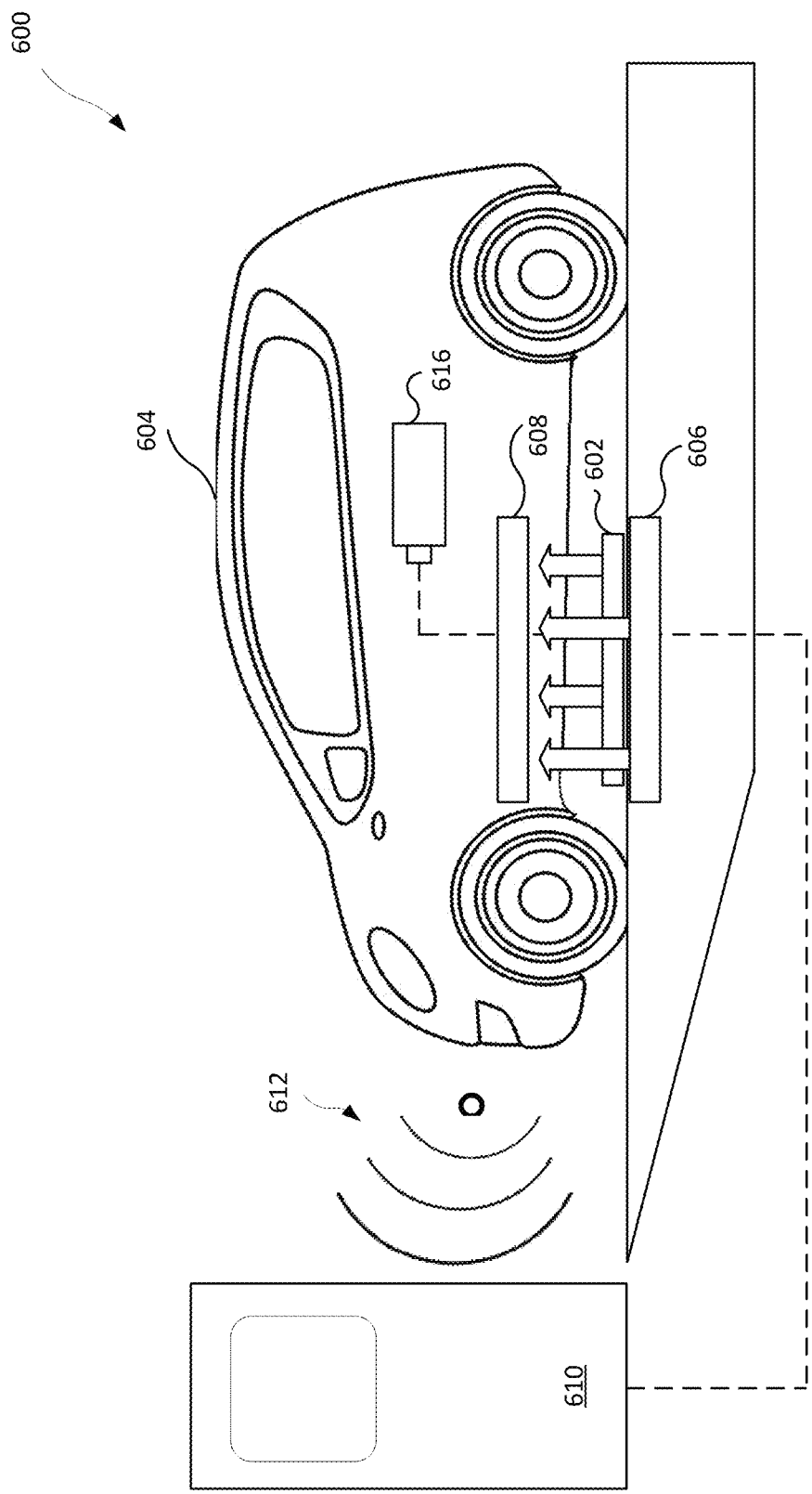
FIG. 6 is a schematic depiction of a calibration of a transfer power measurement system in accordance with one example.

FIG. 6 depicts a transfer power station 600 in which one or more sensors 602 (e.g., sense coils) is used and positioned relative to an official testing vehicle 604. In this example, the sensor 602 is positioned between a transmitter 606 and a receiver 608. In some cases, the sensor 602 is physically secured in place. A charging station 610 delivers power to the vehicle 604 via the transmitter 606 and the receiver 608. The vehicle 604 may then deliver information, such as calibration data, back to the charging station 610 via wireless signals 612. A battery 616 of the vehicle 604 may be charged during the calibration procedure.

The self-inductances and coupling coefficients in the foregoing equation (2) are not easily nor reliably measured. For example, errors in k can affect power estimation quadratically. By abstracting the calibration through constants (A, B, C, D) from equation (2), the individual magnetic parameters do not have to be known, and least squares methods may be used.

Figure 7:
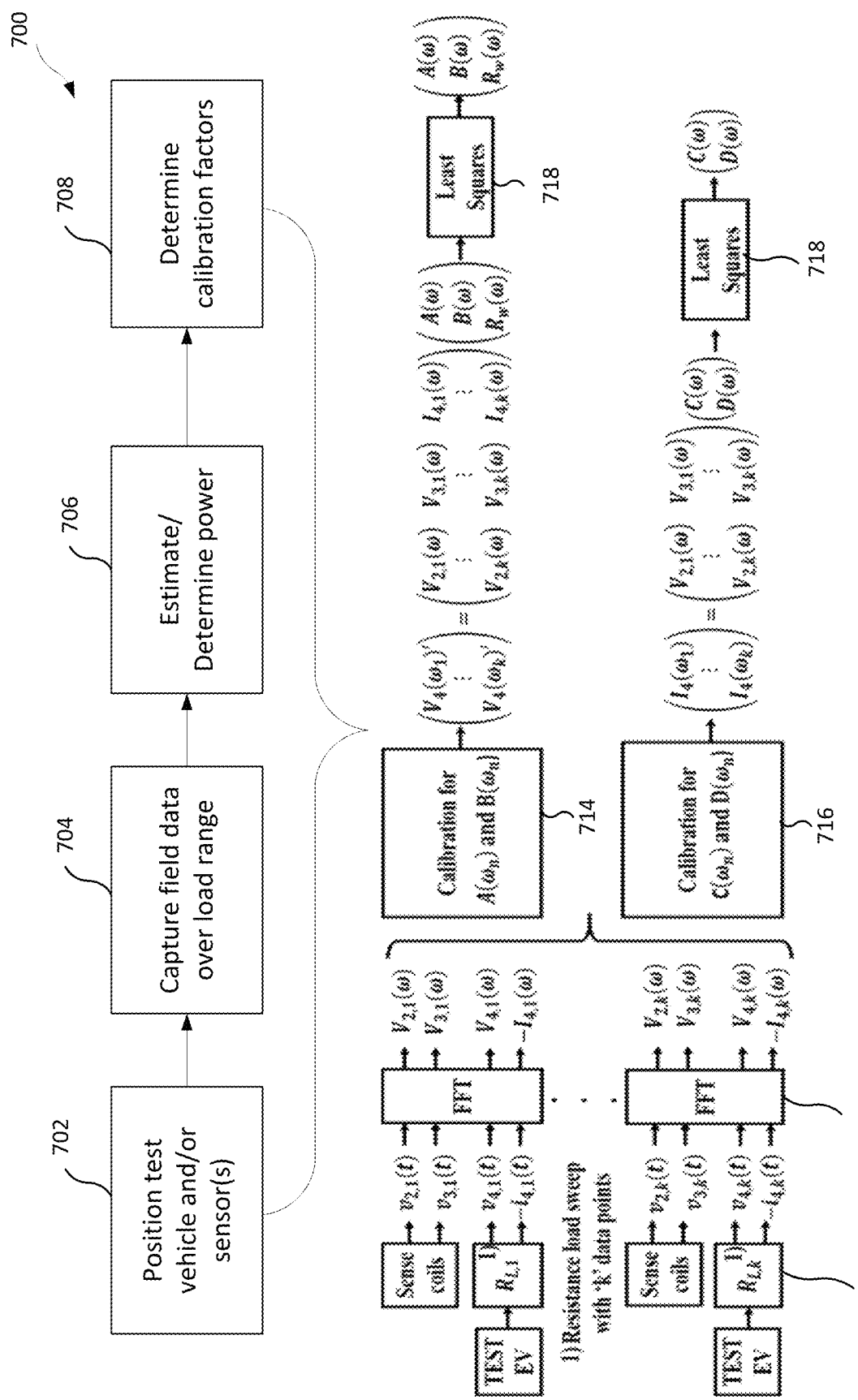
FIG. 7 is a flow diagram of a calibration method for transfer power measurement in accordance with one example.

FIG. 7 depicts a flow diagram of a method 700 of calibrating a wireless power transfer measurement device. The method 700 may be implemented using the calibration system shown in FIG. 6 or another system. In this example, the method 700 includes an act 702 in which a test receiver or test vehicle (EV), such as the vehicle 604, is positioned relative to a transmitter and other components of the wireless power measurement system. In an act 704, field data is captured over a load range with the wireless power transfer measurement device. In an act 706, a power measurement is determined and/or estimated based on the field data. In act 708, a plurality of calibration factors for the wireless power transfer measurement device based on the power measurement are determined. Further details regarding the factor determinations are provided below.

The act 704 may include an act 710 in which a test electric vehicle (TEST EV) or test receiver calibrates power by varying the load resistance ($R_L$). A load voltage ($V'_4$) and a load current ($i_4$) are then measured in the TEST EV. In an act 712, the fast Fourier transform (FFT) is implemented.

Figure 8:
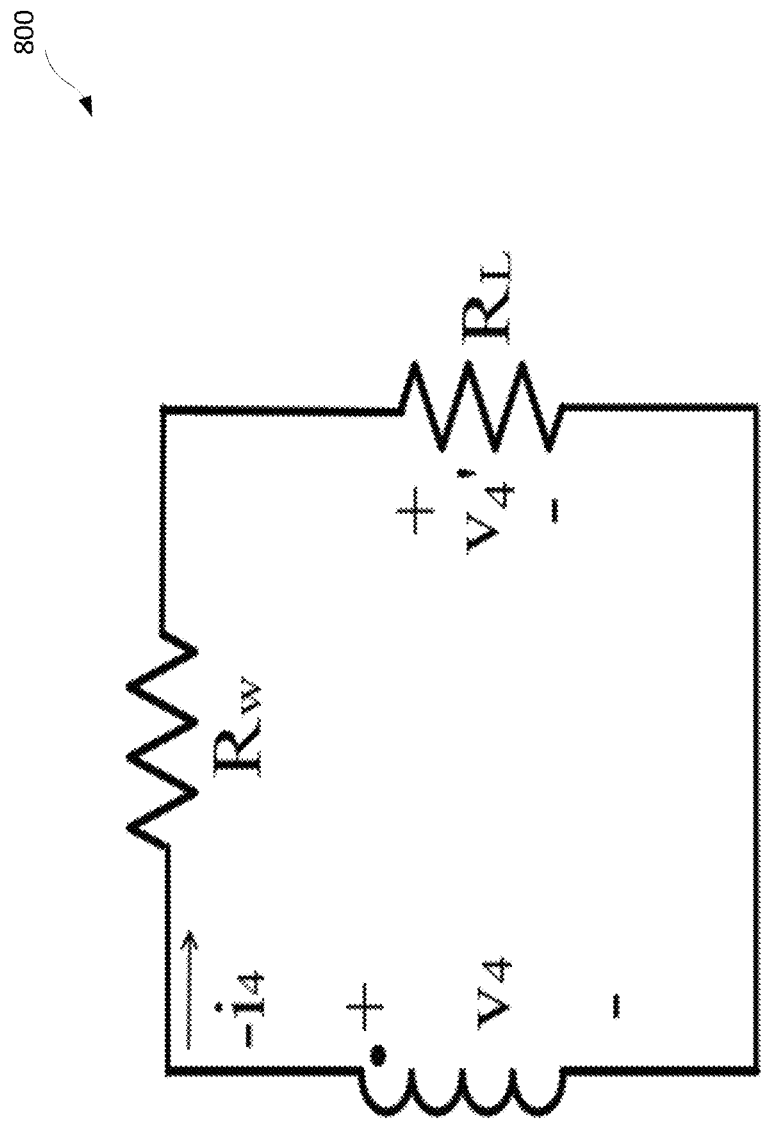
FIG. 8 is a circuit diagram depicting loss factors in a test electric vehicle for use with the disclosed systems and methods.

In this example, a load voltage ($v_4'$) and a current ($i_4$) are accessible in the test electric vehicle, but the load voltage $v_4'$ is not the same as the voltage $v_4$ (see circuit 800 of FIG. 8) because of resistance $R_w$, which encapsulates winding loss. To accurately calibrate, the winding loss is also estimated. This may be performed by dividing the least squares calculation into two acts. First, in an act 714, A, B, and $R_w$ are calculated from measurements of $V_4'$, $V_2$, $V_3$, and $I_4$ over calibration points that include open- and short-circuit loads. Second, in an act 716, C and D are calculated from measurements of $V_2$, $V_3$ and $I_4$.

In an act 718, the calibration error is calculated by using leave-one-out cross-validation. The data is split into two disjoint subsets—a training set and a validation set. In other words, (A, B, C, D) are calculated for each of the 'k' data points using the remaining non-inclusive 'k−1' data points. Power is then estimated using (A, B, C, D) for each of the data points and then compared with measurements. FIG. 9 is an illustration of the leave-one-out cross-validation procedure for error analysis of data presented below.

Figure 10:
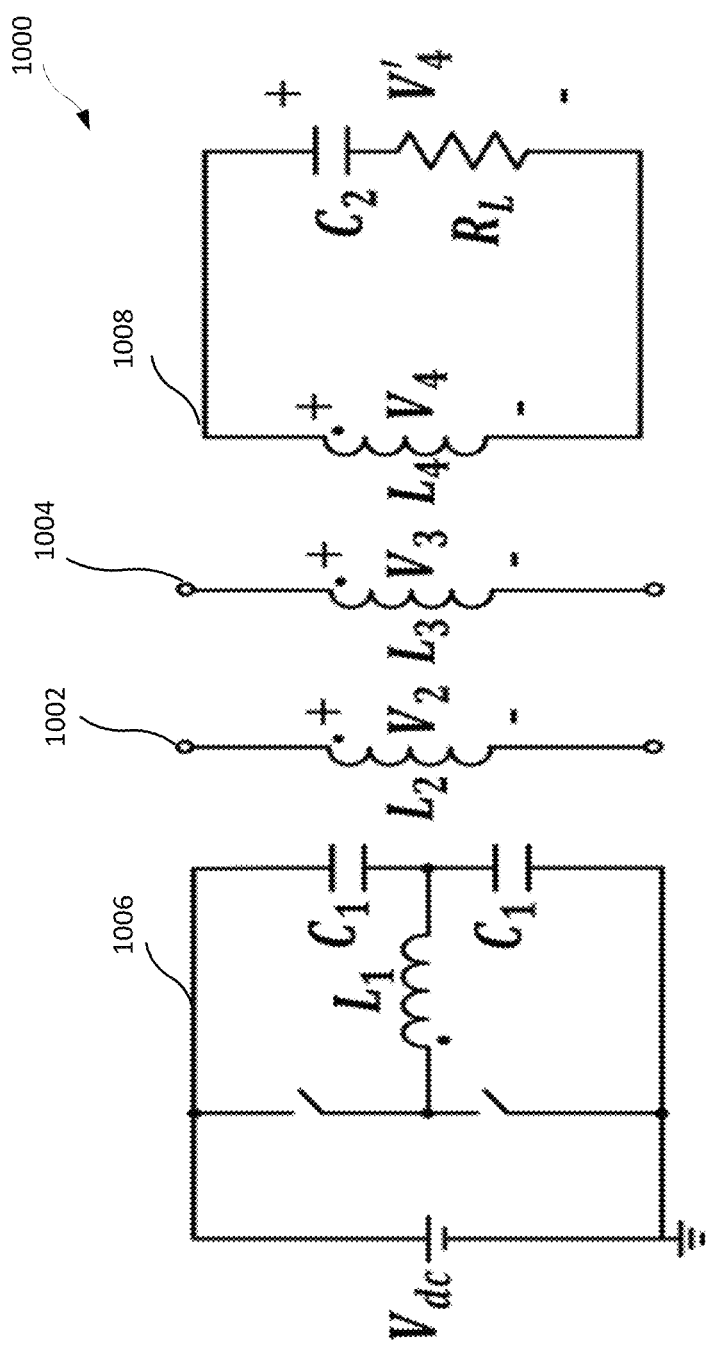
FIG. 10 is a circuit diagram of a wireless power transfer system with transfer power measurement in accordance with one example.

Proof-of-principle experiments using a half-bridge resonant circuit 1000 shown in FIG. 10 were implemented to demonstrate the effectiveness of the transfer-power measurements. Table 1 below shows the specifications for the experiments, where a 96 kHz operating frequency was used as a proxy for the 85 kHz specified in SAE TIR J2954 for wireless power transfer in electric vehicles. Voltage and current were measured on a Tektronix MDO414B-6 and inductances were measured at 100 kHz using an Agilent E4980A. An experimental setup with a transmitter 1006 and a receiver 1008 coil with diameters of 50 cm and sense coil with diameters of 45.7 cm, which typify the scale used in EV wireless power transfer, was used. The distances between the transmitter 1006 and a sense coil 1002, a sense coil 1004, and the receiver 1008 are 8.5 cm, 15 cm, and 20.5 cm, respectively.

TABLE 1

SPECIFICATIONS OF EXPERIMENTS

| Parameters | Value | Parameters | Value |
| --- | --- | --- | --- |
| Transmitter ($L_1$) | 146 µH | Resonant Capacitor ($C_1$) | 10 nF |
| Receiver($L_4$) | 144 µH | Resonant Capacitor ($C_2$) | 30 nF |
| Sense coil 1 ($L_2$) | 64.5 µH | Operating Frequency | 96 kHz |
| Sense coil 2 ($L_3$) | 64.8 µH | $V_{dc}$ | 52.5 V |
| Coupling coefficient ($K_{14}$) | 0.133 | Distance between Tx and Rx | 20.5 cm |
| Coil diameter (Tx, Rx) | 50 cm | | |

Sense coil voltages along with the terminal voltage and current of the receiver coil were measured. Signal processing and calibration were subsequently performed on the 9 data points as shown in FIG. 9. The power estimation errors ranged from 0.059% to 0.839%, which compares favorably with prevailing standards using only an oscilloscope and conventional probes. Table 2 shows that TPM disaggregates the transmitter and receiver losses to enable fair transfer power metering (PTRANSFER).

TABLE 2

EXPERIMENTAL COMPARISON OF TPM FAIR METERING
WITH TERMINAL POWER MEASUREMENTS

| Validation set: Load Resistance($R_L$) | $P_{IN}$: Terminal Power Measurement at Transmitter (W) | $P_{TRANSFER}$: Transfer Power ($P_{TRANSFER}$) TPM (W) | $P_{OUT}$: Terminal Power Measurement at Receiver (W) |
|---|---|---|---|
| 8 Ω | 172.187 | 96.743 | 86.828 |
| 10 Ω | 157.751 | 94.867 | 86.185 |
| 16 Ω | 119.691 | 79.326 | 74.842 |
| 25 Ω | 88.718 | 64.277 | 61.147 |
| 33 Ω | 75.069 | 53.208 | 51.112 |
| 50 Ω | 55.121 | 37.741 | 37.051 |
| 100 Ω | 34.805 | 20.800 | 20.430 |

The number of sense coils may vary. One or more sense coils may be used to resolve the fields respectively generated by the transmitter and the receiver. In one example, a single sensor may include two coils with a center tap.

The configuration of the sensor(s) may also vary. The sensor may not include a coil inductance. The inductance may be provided in other ways. For instance, a microstrip or other transmission line may be used.

Other sensing mechanisms may be used. The systems and methods are not limited to sense coils, inductive sensing, or magnetic field sampling. For example, capacitive sensing is used. The field data may thus include electric field data. In some cases, both inductive and capacitive sensing are used. In such cases, the sensors may be configured to provide field data indicative of both fields. A variety of sensor types may thus be used. For example, magneto-resistive or Hall-effect sensors may be used.

The positioning of the sensor(s) may vary. The sensor(s) may or may not be positioned between the transmitter and the receiver. For instance, in some cases, one or more sensors may be positioned behind the transmitter or the receiver, but nevertheless be configured to sample or otherwise capture the field data. Still other aspects of the systems may differ from the examples described above.

Figure 11:
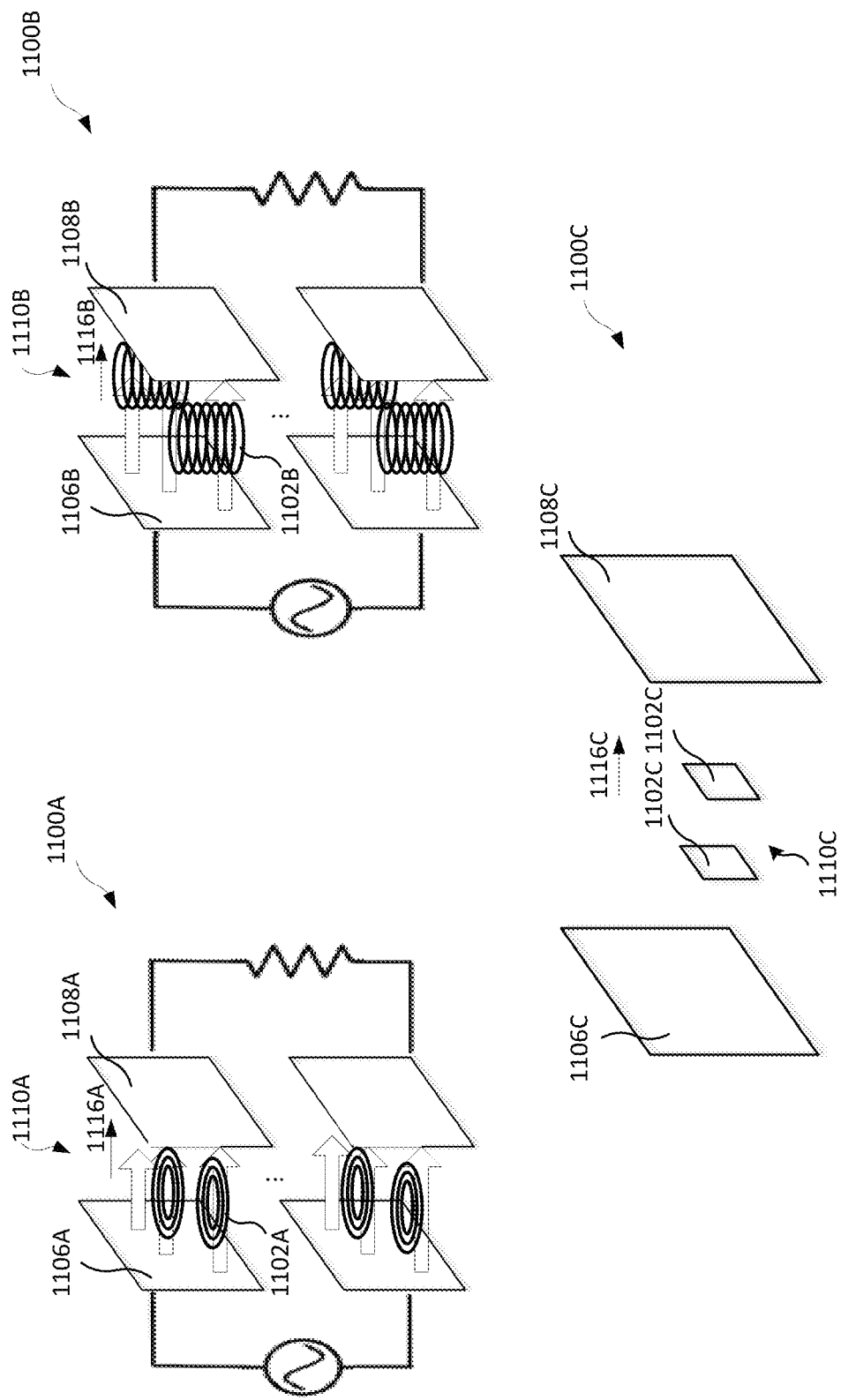
FIG. 11 shows schematic depictions of sense coils and sense plates of a transfer power measurement system in accordance with various examples involving a capacitive charging system.

FIG. 11 depicts several examples of transfer power measurement in capacitive charging systems 1100A, 1100B and 1100C. Each charging system 1100A, 1100B and 1100C includes a respective measurement system 1110A, 1110B and 1110C, respectively. The systems 1110A, 1110B, and 1110C may include one or more sensor(s). In this example, the sensor(s) of the systems 1110A include sense coils 1102A to measure the power produced by an electric field 1116A transferred to receiver plates 1108A. In this case, the sense coils 1102A are oriented in respective planes as shown between the transmitter plates 1106A and the receiver plates 1108A. The sensor(s) of the system 11106 depict an alternative arrangement in which sense coils 11026 are arranged as helical coils to measure the power produced by an electric field 1116B transferred to the receiver plates 1108B. The system 1110C presents another alternative arrangement in which sense plates 1102C are positioned to measure an electric field 1116C between the plates of a transmitter 1106C and a receiver 1108C. The sense plates 1102C may be in parallel with the transmitter plates 1106C and the receiver plates 1108C. In some cases, the sense plates 1102C may have an area that corresponds to about one-tenth of the area of the transmitter plates 1106C and/or receiver plates 1108C. The power measurement may be indicative of real power transferred from the transmitter to the receiver. Additional or alternative types of power may be measured. For example, the reactive power or the apparent power may be measured.

Alternatively or additionally, the power measurement may include a measurement indicative of power loss.

As shown in the examples described above, the target, destination and/or application of the power transfer may vary. In each case, the power may be transferred either inductively or capacitively, and may be considered a wireless power transfer. For instance, the disclosed methods and systems may be used to measure the power transferred to a plasma. Such power transfers may be useful in various applications, including, for instance, plasma processing, lighting, plasma displays, or lasers. In another example, the disclosed methods and systems may be used to measure the power transferred for induction heating. In yet another example, the disclosed methods and systems may be used to measure the power transferred to a mechanical device. The power may thus be transferred for the purpose of mechanical motion. The disclosed methods and systems may also be used to measure the power lost to biological tissue or other intervening or otherwise nearby material, which may or may not be biological. For example, the method may be used to determine the specific absorption rate (SAR).

Misalignment of the transmitter and the receiver may be addressed by the above-described systems and methods. The sense coils or other sensors may be used to provide information regarding the misalignment. For instance, additional (e.g., more than two) sensors may be provided in some cases to capture information indicative of the misalignment.

Figure 12:
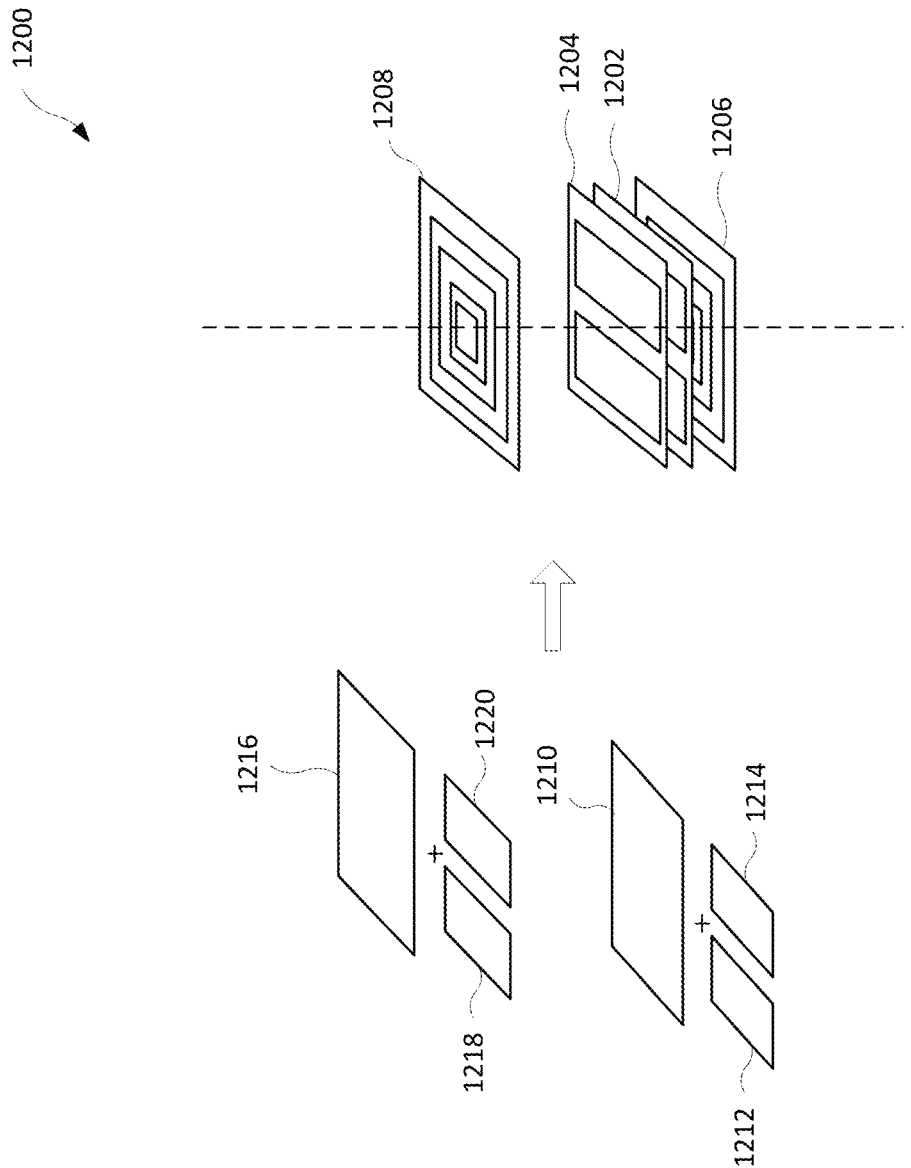
FIG. 12 shows schematic depictions of a sense coil arrangement configured to provide misalignment information in accordance with one example.

FIGS. 12-15 depicts examples of different sense coil arrangements to determine misalignment. FIG. 12 depicts a sense coil arrangement 1200 that includes a transmitter 1206 and a receiver 1208. In this example, a sense coil 1210 has a voltage of $V_2$ and a sense coil 1216 has a voltage of $V_3$. This arrangement includes a sense coil 1212 with a voltage of $V_{2\_1}$ and a sense coil 1214 with a voltage of $V_{2\_2}$. Sense coils 1210, 1212 and 1214 are combined to form a sense coil 1202. This arrangement further includes a sense coil 1218 having a voltage of $V_{3\_1}$ and a sense coil 1220 having a voltage of $V_{3\_2}$. Sense coils 1216, 1218 and 1220 are combined to form a sense coil 1204. Sense coils 1202 and 1204 are disposed between the transmitter 1206 and the receiver 1208. When alignment is perfect, the coils are arranged and configured such that $V_{2\_1}+V_{2\_2}=0$ and $V_{3\_1}+V_{3\_2}=0$.

FIG. 13 depicts a sense coil arrangement 1300 that includes a transmitter 1306 and a receiver 1308. In this example, a sense coil 1310 has a voltage of $V_2$ and a sense coil 1316 has a voltage of $V_3$. This arrangement includes a sense coil 1312 with a voltage of $V_{2\_1}$ and a sense coil 1314 with a voltage of $V_{2\_2}$. Sense coils 1310, 1312 and 1314 are combined to form a sense coil 1302. This arrangement further includes a sense coil 1318 having a voltage of $V_{3\_1}$ and a sense coil 1320 having a voltage of $V_{3\_2}$. Sense coils 1316, 1318 and 1320 are combined to form sense coil 1304. Sense coils 1302 and 1304 are disposed between the transmitter 1306 and the receiver 1308. When alignment is perfect, the coils are arranged and configured such that $V_{2\_1}+V_{2\_2}=0$ and $V_{3\_1}+V_{3\_2}=0$.

Figure 14:
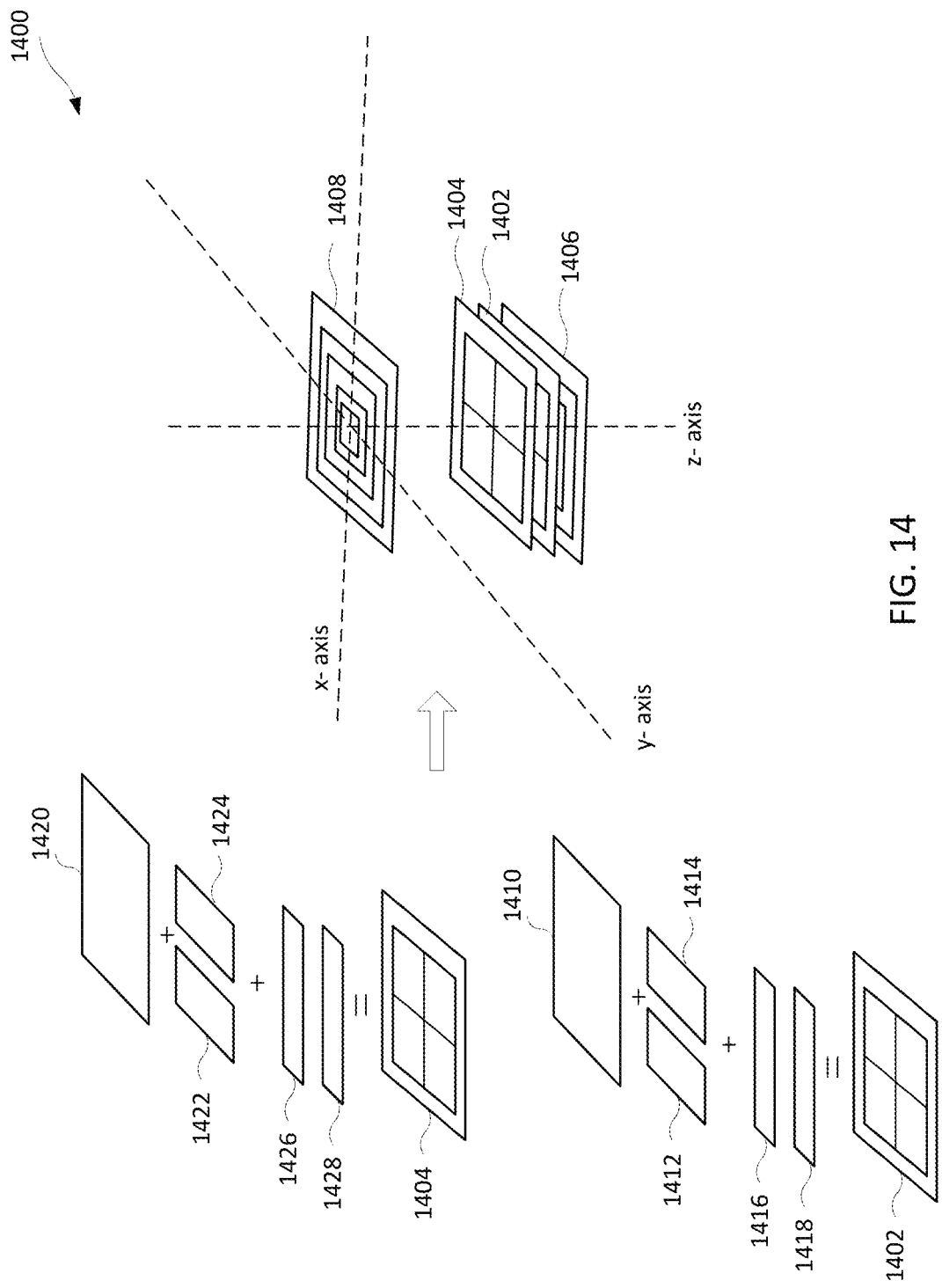
FIG. 14 shows schematic depictions of yet another sense coil arrangement configured to provide misalignment information in accordance with one example.
Figure 15:
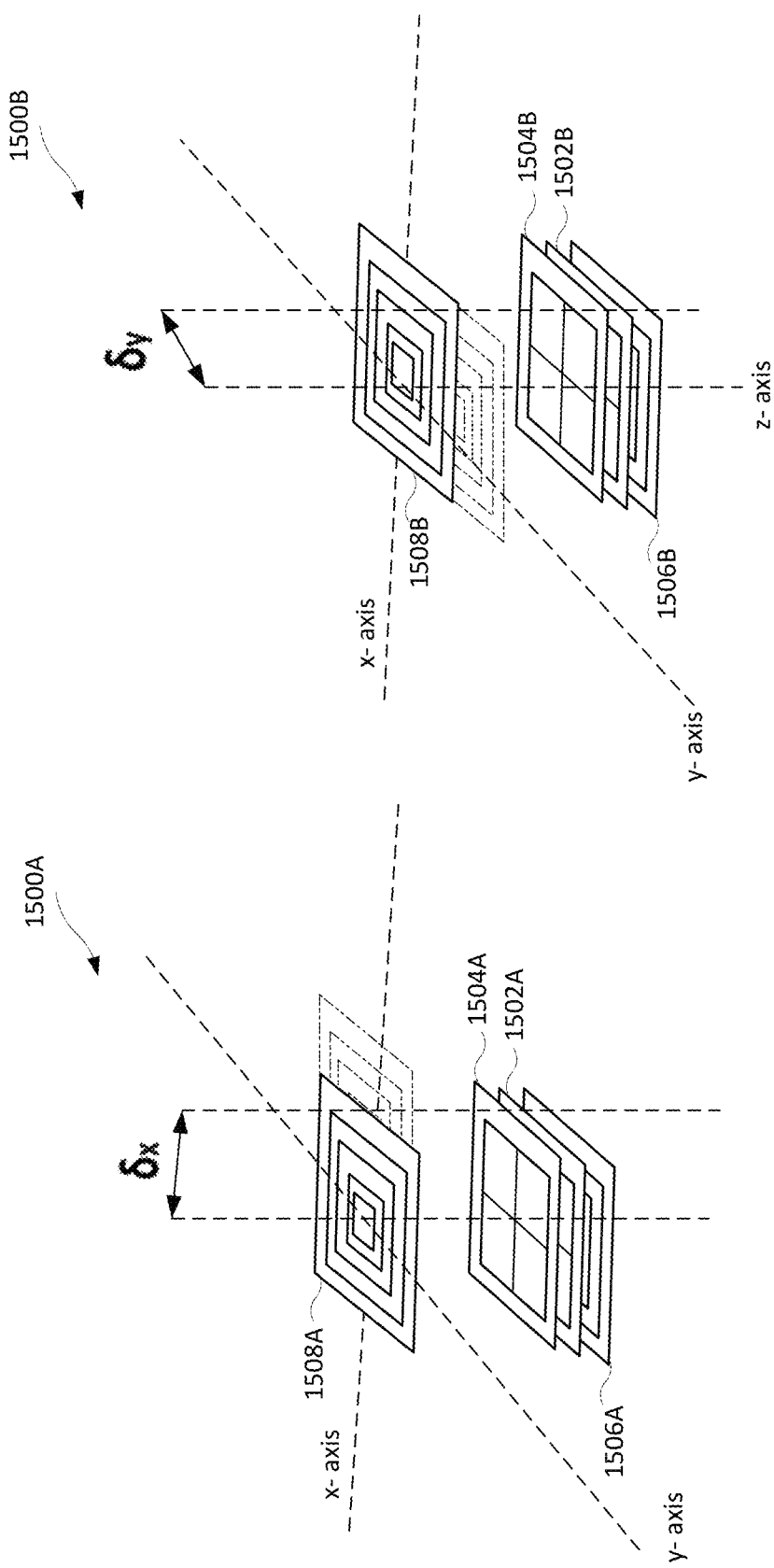
FIG. 15 shows schematic depictions of a sense coil arrangement providing misalignment information in accordance with one example.

Misalignment then gives non-zero values. FIG. 14 and FIG. 15 provide two examples that distinguish between misalignment along x- and y-axes. The same principle applies. FIG. 14 depicts a sense coil arrangement 1400 that includes a transmitter 1406 and a receiver 1408. In this example, a sense coil 1410 has a voltage of $V_2$ and a sense coil 1420 has a voltage of $V_3$. This arrangement includes a sense coil 1412 with a voltage of $V_{2\_x1}$ and a sense coil 1414 with a voltage of $V_{2\_x2}$. This arrangement further includes a sense coil 1416 with a voltage of $V_{2\_y1}$ and a sense coil 1418 with a voltage of $V_{2\_y2}$. Sense coils 1410, 1412, 1414, 1416, and 1418 are combined to form sense coil 1402. This arrangement further includes a sense coil 1422 with a voltage of $V_{3\_x1}$ and a sense coil 1424 with a voltage of $V_{3\_x2}$. This arrangement further includes a sense coil 1426 with a voltage of $V_{3\_y1}$ and a sense coil 1428 with a voltage of $V_{3\_y2}$. Sense coils 1420, 1422, 1424, 1426, and 1428 are combined to form sense coil 1404. Sense coils 1402 and 1404 are disposed between the transmitter 1406 and the receiver 1408. Perfect alignment along both the x-axis and the y-axis is indicated by $V_{2\_x1}+V_{2\_x2}=0$, $V_{2\_y1}+V_{2\_y2}=0$, and $V_{3\_x1}+V_{3\_x2}=0$, $V_{3\_y1}+V_{3\_y2}=0$.

FIG. 15 depicts two examples showing misalignment. A sense coil arrangement 1500A includes a transmitter 1506A and a receiver 1508A. Sense coils 1502A and 1504A are disposed between the transmitter 1506A and the receiver 1508A. In this example, the receiver 1508A is misaligned along the x-axis. FIG. 15 additionally depicts a sense coil arrangement 1500B which includes a transmitter 1506B and a receiver 1508B. Sense coils 1502B and 1504B are disposed between the transmitter 1506B and the receiver 1508B. In this example, the receiver 1508A is misaligned along the y-axis.

With these sense coil arrangements, the coupling coefficient may be expressed and modeled over $\delta$ via Taylor series. With the Taylor Series, a representation of a function is provided as an infinite sum of terms that are calculated from the values of the function's derivatives at a single point. For example, if $K'_{34}=\alpha_0+\alpha_1\delta+\alpha_2\delta^2$ L where $\alpha_0=K_{34}$ perfect alignment is present when $\delta=0$ Therefore, a new K may be estimated with respect to misalignment and thus power estimation.

Figure 16:
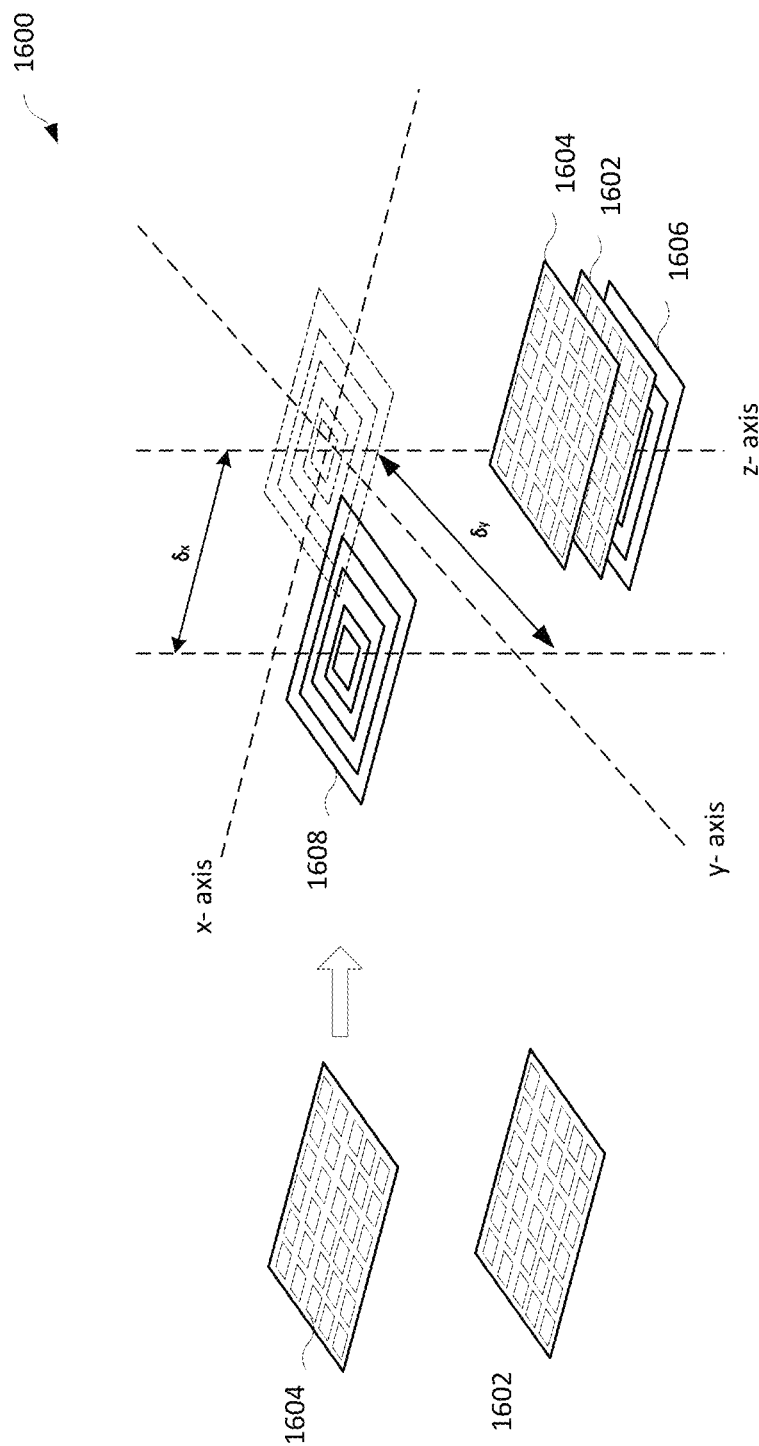
FIG. 16 shows schematic depictions of a sense coil arrangement configured to provide misalignment information in accordance with one example.
Figure 17:
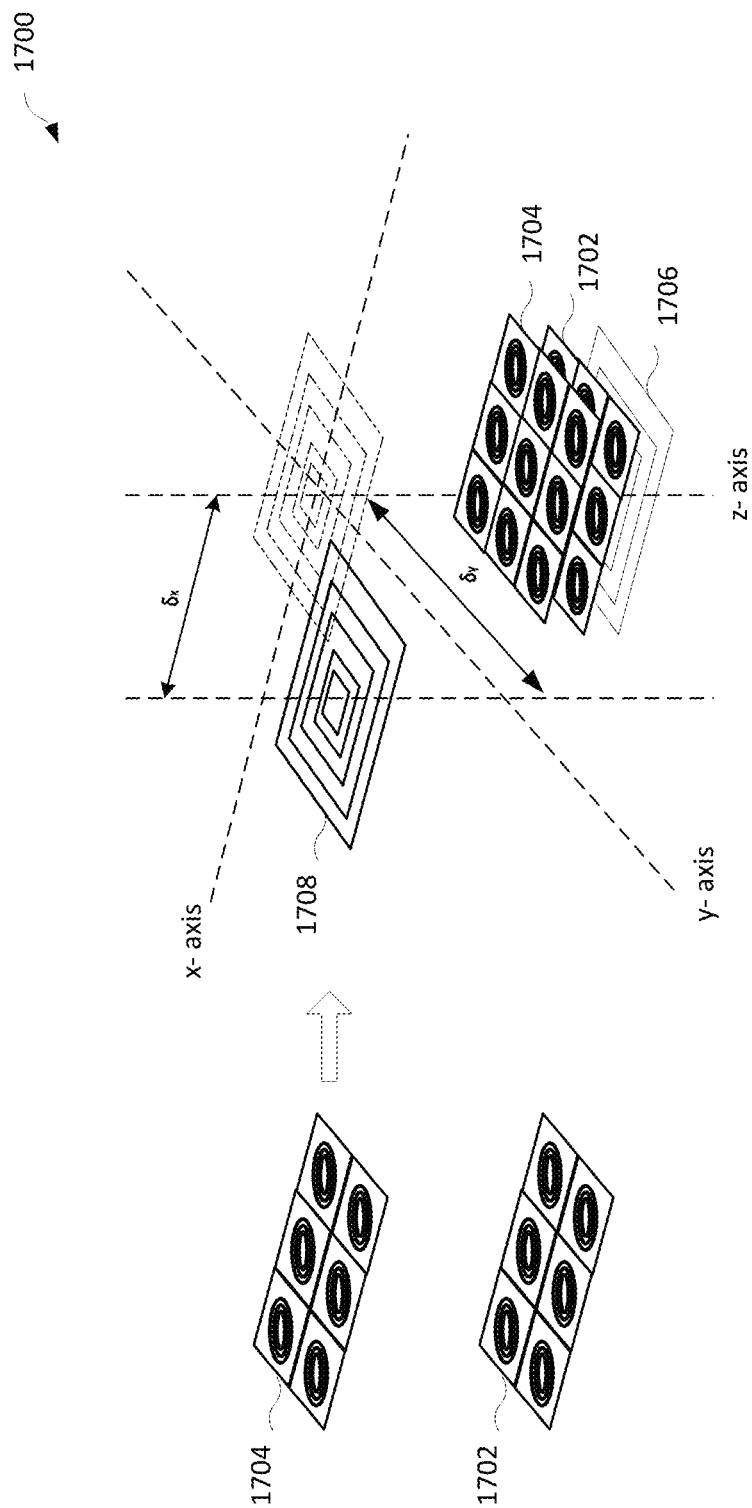
FIG. 17 shows schematic depictions of another sense coil arrangement configured to provide misalignment information in accordance with one example.

FIGS. 16 and 17 depict alternative example arrangements to determine misalignment. FIG. 16 depicts an example in which 2 sense coils 1602 and 1604 are disposed between a transmitter 1606 and a receiver 1608. The 2 sense coils 1602 and 1604 have pixel coils. The above-described principles may be applied to the sense coils 1602 and 1604 having pixel coils for misalignment. In another example, FIG. 17 depicts a respective integrated circuit that provides each coil shown in sense coil arrangement 1702 and 1704. In this example, 2 sense coils 1702 and 1704 are arranged between the transmitter 1706 and the receiver 1708. In this case, the receiver 1708 is misaligned along the x-axis and y-axis. In still other examples, sense coils may be configured with a respective shape to generate or establish a linear relationship between the coupling coefficient K and the misalignment distance ($\delta$).

Additional methods to improve the calibration of the transfer-power measurement over multiple misalignments may be used. As described above, the magnetic and geometric parameters may be calibrated by measuring the voltage of the receiver $V_R$, the current of the receiver $I_R$ and the sense coil voltages. $V_R$ can be represented in equation (5) below.

$$V_R = j\omega M_{TR} I_{TR} + j\omega L_R I_R \qquad (5)$$

Equation 5 is caused by the superposition of the incident and the reflected induced electric fields, where $(V_T, I_T)$ is the Tx voltage and current, $M_{TR}$ is the mutual inductance between Tx and Rx. $L_R$ is for the self-inductance of Rx. $V_R$ cannot be measured directly because of the unknown winding resistance. Only the terminal Rx voltage ($V'_R$) can be measured.

In this example, as shown in equation (6), the Rx winding resistance $R_R$ is included in $V'_R$.

$$V'_R = \underbrace{j\omega M_{TR} I_T + j\omega L_R I_R}_{V_R} + R_R I_R \qquad (6)$$

Therefore, for the Rx voltage estimation in equation (6), $R_R$ and the parameters (A, B) from equation (2) are calibrated together from the Rx terminal voltage and current, as well as sense coil voltages as shown in equation (7) below.

$$V'_R = AV_1 + BV_2 + R_R I_R \qquad (7)$$

Calibration may then be improved by using a different resistance $R_R$ for calibration points with a different misalignment position. $R_R$ is an effective winding resistance in the sense that it includes the eddy current losses on transmitter from the leakage magnetic field of Rx. This makes $R_R$ dependent on the coupling coefficient between the receiver and the transmitter, which is a function of misalignment position.

The calibration model includes several aspects, including: off-diagonal losses (can be modeled as a mutual resistance) are assumed to be small; and transfer power accuracy from calibration can only be validated indirectly by comparing the estimate of the output power with its measured value—the strength of this validation depends on the calibration model being axiomatic. Finite element simulation in the future will help validate confidence in the calibration model.

In previous experiments, the worst case error was 0.06% for a stationary receiver. Because calibration was performed for only the aligned case, as the receiver moves out of laterally, errors progressively increase in the estimation of transfer power, which is shown below.

The parameters A, B, C, D used for the estimation in equation (2) are functions of the coupling coefficients to the receiver, which in turn depend on the misalignment x. The misalignment error shown in equation (8) can be derived from the coupling coefficients. In equation (8) below, where $x_0=0$ is the aligned initial calibration point.

$$\varepsilon_{mis}(x) = 1 - \frac{k_{TR}(x_0)}{k_{TR}(x)} \frac{k_{T2}k_{R1}(x) - k_{T1}k_{R2}(x)}{k_{T2}k_{R1}(x_0) - k_{T1}k_{R2}(x_0)} \qquad (8)$$

Figure 18:
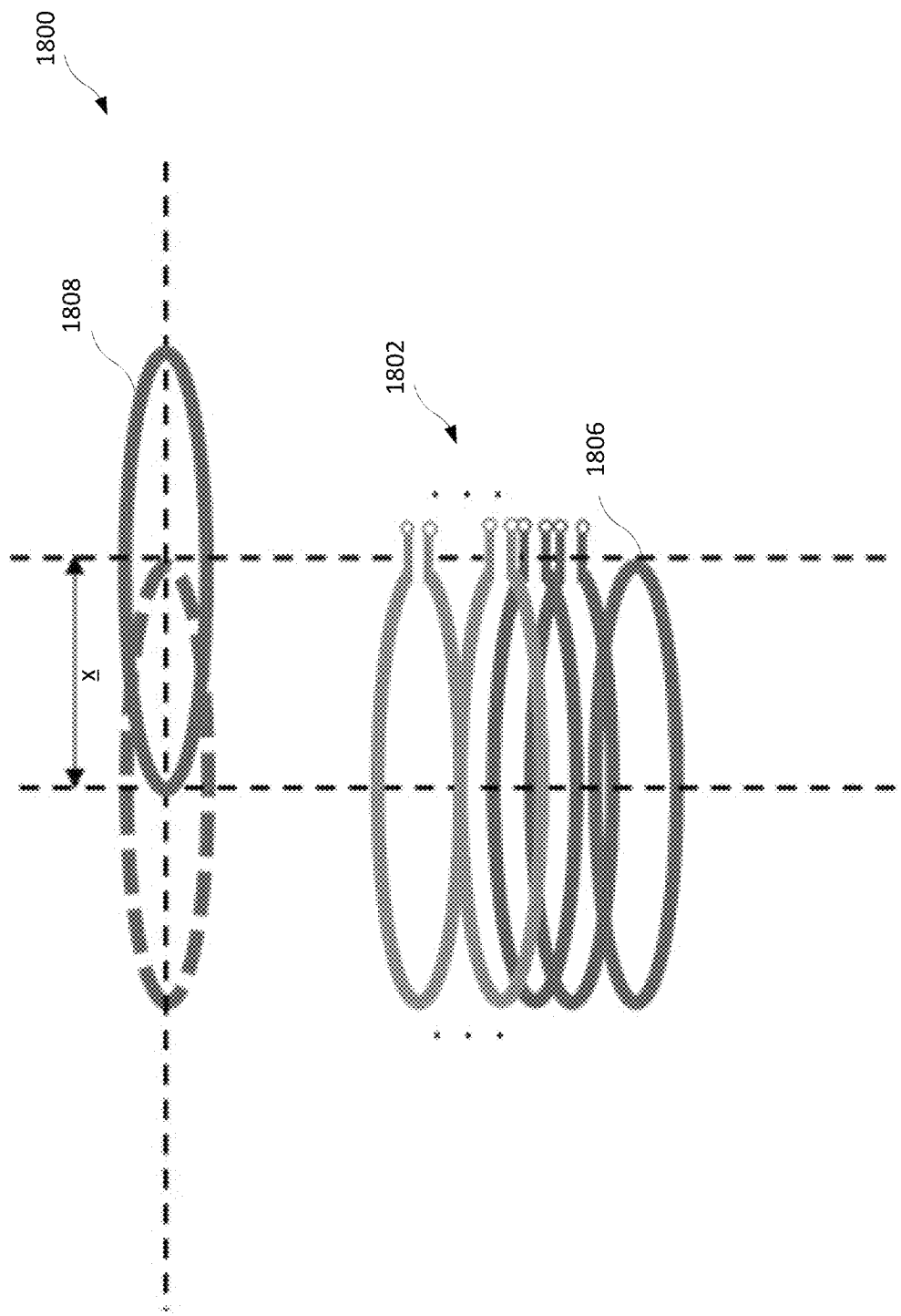
FIG. 18 is a schematic depiction of a sense coil arrangement configured to provide misalignment information in accordance with one example.

Multiple coils may be used to minimize the misalignment error. FIG. 18 depicts a system 1800 in which a receiver coil 1808 is laterally misaligned. Additionally, system 1800 includes multiple sense coils 1802 and a transmitter coil 1806. The multiple sense coils 1802 implicitly give additional information that is used to counteract misalignment errors. Information regarding the change of the coupling coefficients is needed to reduce misalignment errors. The greater the number of the sense coils 1802, the more information that may be obtained. The co-axial placement of the multiple sense coils 1802 results in a 360 degree symmetry for misalignment in any direction. Alternatively, or additionally, the receiver coil 1808 may be vertically misaligned. Alternatively, or additionally, the receiver coil 1808 may be angularly misaligned.

Figure 19:
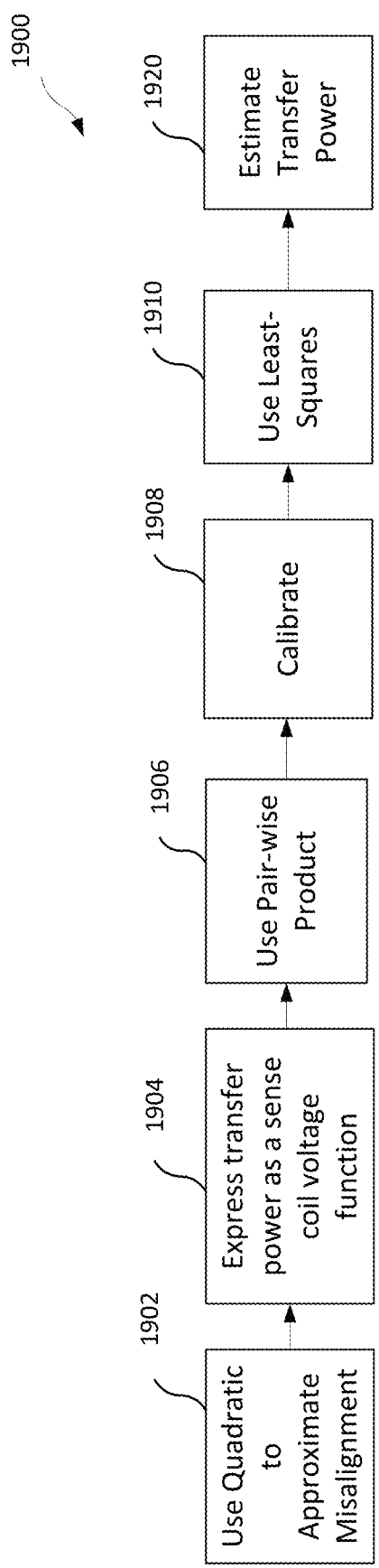
FIG. 19 is a flow diagram of a calibration method for transfer power measurement in accordance with one example.

FIG. 19 depicts a method 1900 for calibrating the estimation of transfer power. The method 1900 may include an act 1902 in which the misalignment variation of the coupling coefficients is approximated with a quadratic. In an act 1904, the transfer power is expressed as a function of the sense coil voltages and an approximately quadratic parameter that is a function of the quadratic coupling coefficients. In an act 1906, the pairwise-products of sense-coil voltages are expressed as a function of the transfer power and linear combinations of this quadratic parameter. In an act 1908, the calibration model is used to derive the transfer power from measurements of the receiver terminal voltage and current. In an act 1910, the least-squares are used to recover the constant coefficients assuming that the quadratic parameters are affine functions of each other.

The transfer power may then be estimated in an act 1920 using the calibrated constant coefficients with pairwise-products of sense coil voltages.

Quadratic approximations of coupling coefficients may be used. It is advantageous to choose sense coil positions and radii so that the coupling coefficients to the receiver are quadratic dominant and form a nearly affine set. An affine set may be defined as the range of an affine mapping. It is important to note that coupling coefficient functions are positive definite; the quotient of these functions from a quadratic dominant and affine set is also quadratic dominant and also form a nearly affine set. Sense coils that are coaxial are especially good candidates for a quadratic dominant and affine set of coupling coefficients. In the algorithm for TPM using multiple sense coils described below, a parameterization of coupling coefficients based on quotients that form a quadratic dominant and affine set result in particularly good results for least squares optimization in the calibration algorithm.

A quadratic approximation is derived for the mutual inductance from Grover's formula, which is accurate for two circular filaments with lateral misalignment. A Taylor expansion is performed with respect to lateral misalignment. In bounding the Lagrangian remainder, it can be shown that the second order Taylor approximation is accurate enough over the misalignment range of interest.

Figure 20:
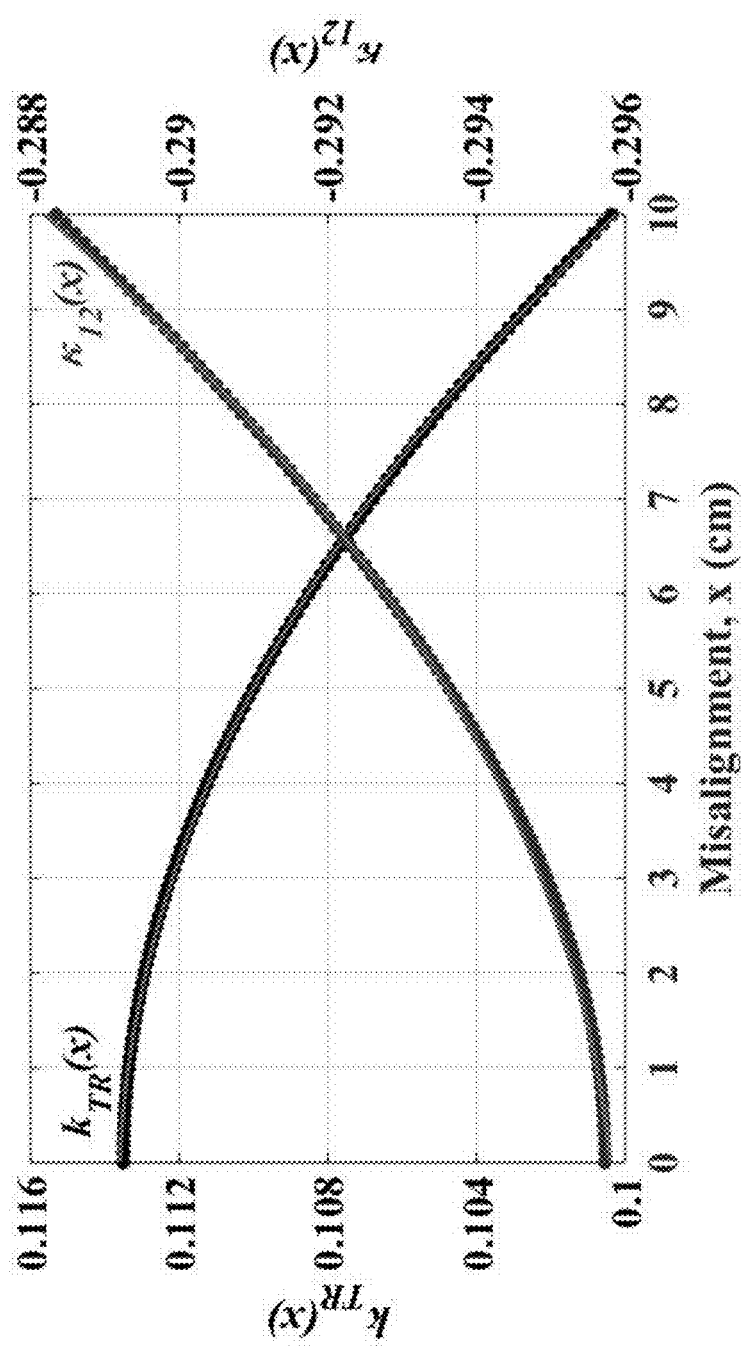
FIG. 20 are plots of a coupling coefficient and a parameter function of a wireless power transfer system as a function of misalignment in accordance with an example.
Figure 21:
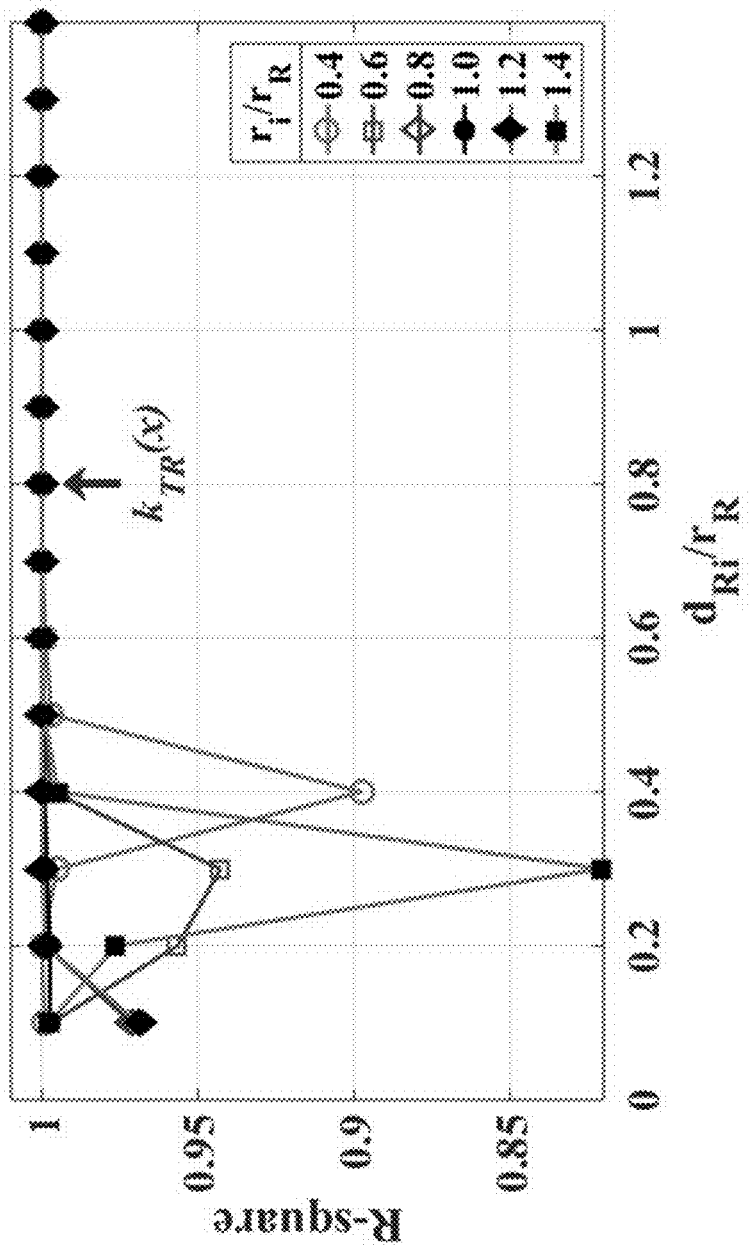
FIG. 21 is a plot of a coupling coefficient function of a wireless power transfer system in accordance with an example.

FIG. 20 are plots of an experimental setup for transfer-power measurement under misalignment. Referring to FIG. 20, the coupling coefficient between the transmitter and the receiver from a numerical calculation of mutual inductance is plotted over a 10 cm misalignment. FIG. 21 depicts plots showing that the R-square metric for $2^{nd}$ order polynomial fits of all the relevant coupling coefficients as the normalized z-axis position and radius of the sense coils are varied. The farther from the receiver coil, the closer it is to quadratic. The radii of the transmitter and the receiver, $r_T$ and $r_R$ respectively, each chosen to be 25 cm with a separation $d_{TR}$ of 20 cm and a maximum misalignment of 10 cm, is typical of wireless power transfer for EVs according to SAE J2954. FIG. 21 demonstrates that proper choice of the geometry of the set of sense coils results in a quadratic dominant form of the coupling coefficients.

Transfer-power can be directly estimated from the sense coil voltages as shown in equation (9) in which $V_i(x)$, $V_j(x)$ are sense coil voltages at a particular misalignment x.

$$P_{Transfer}(x) = \text{Re}\{V_R(x)I_R^*(x)\} \quad (9)$$
$$= \frac{1}{\kappa_{ij}(x)} \text{Im}\{V_i(x)V_j^*(x)\}$$

where $\kappa_{ij}(x) = \omega\sqrt{L_iL_j}\dfrac{k_{Tj}k_{Ri}(x) - k_{Ti}k_{Rj}(x)}{k_{TR}(x)}$ A pairwise-product between sense coil voltages may be defined as shown in equation (10).

$$\langle V_a, V_b \rangle @ \text{Im}\{V_a V_b^*\} \quad (10)$$

The transfer power in equation (9) can be derived from separately from each pairwise-product of sense coil voltages along with their corresponding parameter $\kappa_{ij}(x)$. If the pairwise-product of voltages from each unique pair of sense coils are linearly combined and scaled by a coefficient $\alpha_{ij}$ as in equation (11), the parameter $\kappa_{ij}(x)$ can be approximated as a quadratic shown in equation (12).

$$\sum_{i,j \in S} \alpha_{ij}\langle V_i, V_j \rangle = P_{Transfer}(x)\left\{\sum_{i,j \in S} \alpha_{ij}\kappa_{ij}(x)\right\} \quad (11)$$

$$S = \{(i,j,) \mid i \neq j \wedge (i,j) \text{ unique pairing}\}$$

$$\kappa_{ij}(x) \approx p_{ij} + q_{ij}x + r_{ij}x^2 \quad (12)$$

It can be shown that a quotient of quadratic functions can be well-approximated by another quadratic as shown in FIG. 20 when those original functions are positive definite.

If $\kappa_{ij}(x)$ form an affine set, $\alpha_{ij}$ can be chosen in equation (13) so that:

$$\sum_{i,j \in S} \alpha_{ij}\kappa_{ij}(x) \approx \sum_{i,j \in S} \alpha_{ij}p_{ij} + \sum_{i,j \in S} \alpha_{ij}q_{ij}x + \sum_{i,j \in S} \alpha_{ij}r_{ij}x^2 \quad (13)$$

$$\sum_{i,j \in S} \alpha_{ij}\kappa_{ij}(x) \approx 1$$

where, $$\sum_{i,j \in S} \alpha_{ij}p_{ij} \approx 1, \quad \sum_{i,j \in S} \alpha_{ij}q_{ij} \approx 0, \quad \sum_{i,j \in S} \alpha_{ij}r_{ij} \approx 0, \quad \alpha_{ij} \in {}^\circ$$

A least-squares optimization is used to obtain $\alpha_{ij}$ in equation (14). The linear combination of the pair-wise product $\langle V_i, V_j \rangle$ minimizes TPM errors under misalignment. The minimization problem is formulated to take advantages of the quadratic and affine approximation of $\kappa_{ij}(x)$. The linear combination of the pair-wise product of the sense coil voltage with a constant coefficient of $\alpha_{ij}$ can approximate the transfer of power at any misalignment x. This formulation is insensitive to misalignment since $\alpha_{ij}$ is constant and can be calibrated once. It can be used at any misalignment points.

$$\min_{a_{ij}} \left\| P_{Transfer}(x) - \hat{A}_{i,j \in S} a_{ij}\langle V_i, V_j \rangle \right\|_2 \quad (14)$$

subject to $a_{ij} \in {}^\circ$

Approximation errors that are deviations from a quadratic as well as from an affine set are homomorphic to errors in the sense coil voltages.

The transfer-power can then be estimated despite misalignment from the unique pair-wise product of sense coil voltages in equation (15) below.

$$P_{Transfer}(x) = \sum_{i,j \in S} \alpha_{ij}\langle V_i, V_j \rangle \quad (15)$$

$$S = \{(i,j) \mid i \neq j \wedge (i,j) \text{ unique pairing}\}$$

Figure 22:
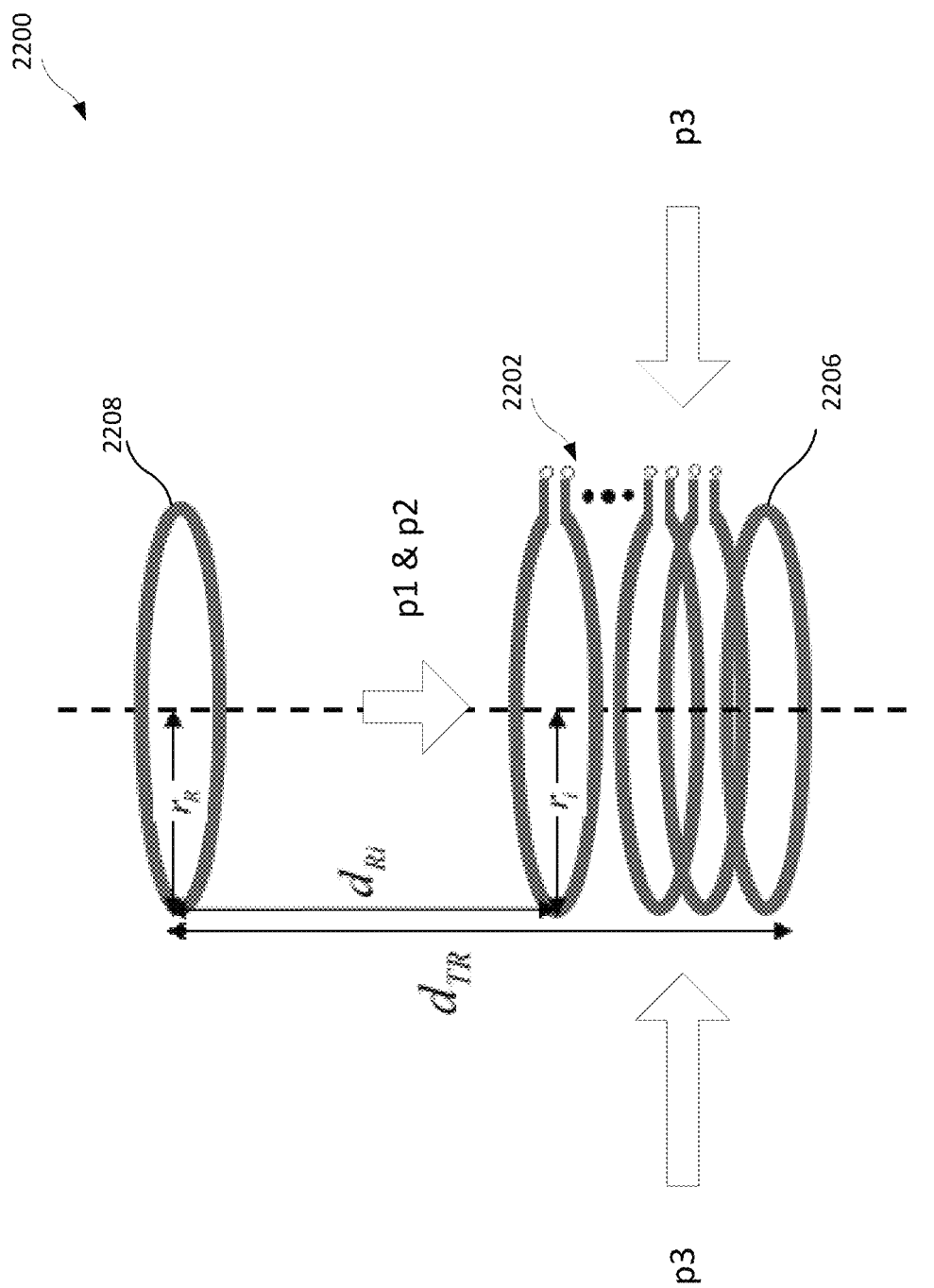
FIG. 22 is a schematic depiction of multiple sense coils to illustrate optimization of coil size and position using penalty functions in accordance with one aspect.

FIG. 22 depicts a system 2200 including a transmitter coil 2206, sense coils 2202 and a receiver coil 2208 in which the size and the positions of the sense coils 2202 may be optimized by using penalty functions as shown in equation

(16) below. Three penalty functions are constructed based on error factors, physical constraints, and noise concern with respect to the geometry of the sense coils. The minimization of the weighted sum of the three penalty functions p1, p2 and p3 can optimize sense coil 2202 size and positions. In FIG. 22, $p_1$ is the deviation from the quadratic approximation. $p_2$ represents the sense coils 2202 that can not be placed at the same z-axis position. $p_3$ represent the low SNR from the small sense coil voltage.

$$\min y + w_1 p_1 + w_2 p_2 + w_3 p_3 \quad (16)$$

The foregoing methods for the calibration and estimation of TPM are compared with the numerical results derived from a well-known model for mutual inductance and T-equivalent circuit model for the voltage and current. The model assumptions include: concentrated windings with infinitesimal diameters (filaments); fundamental frequency only; and noiseless.

Numerical data is calculated over a range of resistive loads and misalignments. Calibration is performed over this data and estimation performance is evaluated using leave-one-out cross-validation.

Figure 23:
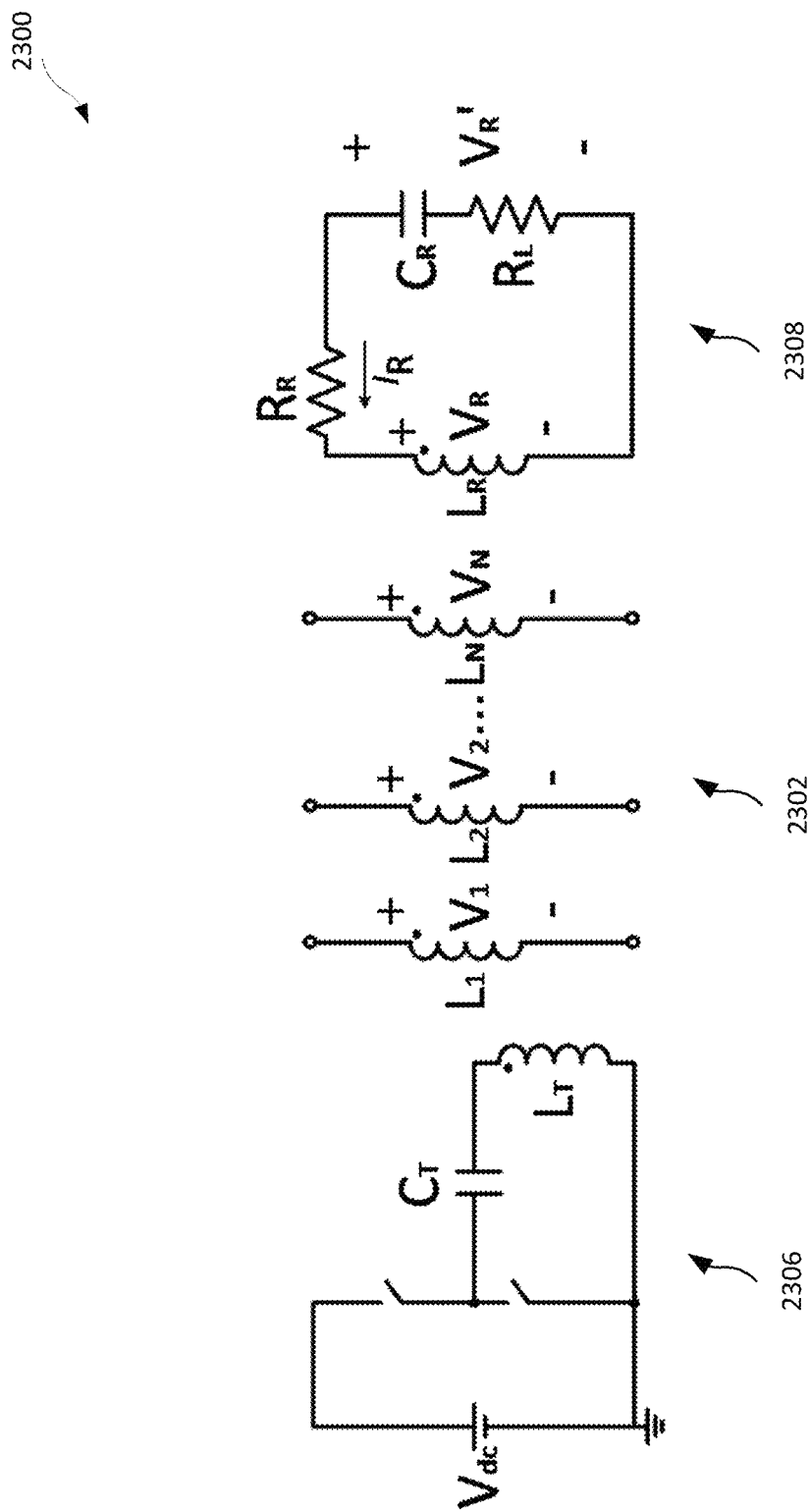
FIG. 23 is a circuit diagram of a wireless power transfer system under misalignment in accordance with one example.

FIG. 23 depicts the equivalent circuit 2300 for the numerical model. Series-series resonant circuits drive the WPT system and a resistive load ($R_L$) is used. Sense coils 2302 are open-circuited. Between two and six sense-coils 2302 are used to estimate transfer-power. The radius of the receiver (Rx) 2308 is 25 cm. The ratio of the radii of sense coils 2302 to that of the receiver 2308 is fixed at 1. The ratio of the distance between the transmitter (Tx) 2306 and the receiver 2308 to the radius of the receiver 2308 is 0.8. Every sense coil 2302 is located between the transmitter 2306 and the receiver 2308 and are placed at 1 cm intervals. The largest ratio of the sense-coil-Rx distance to the radius of the receiver 2308 ($d_{Ri}/r_R$) is 0.76 and the smallest is 0.56. Table 3 below shows the variation of parameters for each coil.

TABLE 3

Specifications of Numerical Model

| Parameters | Value | Parameters | | Value |
|---|---|---|---|---|
| Tx and Rx coil Radius: $r_T$, $r_R$ | 25 cm | $\dfrac{r_i}{r_R}$ | | 1 |
| Tx and Rx coil distance: $d_{TR}$ | 20 cm | $\dfrac{d_{Ri}}{r_R}$ | i = 1 | 0.76 |
| | | | 2 | 0.72 |
| | | | 3 | 0.68 |
| | | | 4 | 0.64 |
| | | | 5 | 0.60 |
| | | | 6 | 0.56 | a. $r_i$: Sense coil radius
b. $d_{Ri}$: Distance between Rx and sense coils

The calibration matrices are implemented as follows. The resistive load and misalignment are swept for calibration of $\alpha_{ij}$. From m-resistive load (10Ω to 100Ω) and n-misalignment (0 cm to 10 cm), sense coil voltages (N unique pairing) and transfer-power in equation (9) are measured at (m×n) different data points. Then a matrix, $\underline{V} \in {}^{\circ(mn) \times N}$, can be constructed as equation (17) below.

$$\underline{V} = \begin{pmatrix} \langle V_1(R_{L(1),x(1)}), V_2(R_{L(1),x(1)}) \rangle & K & \langle V_i(R_{L(1),x(1)}), V_j(R_{L(1),x(1)}) \rangle \\ M & O & M \\ \langle V_1(R_{L(m),x(n)}), V_2(R_{L(m),x(n)}) \rangle & K & \langle V_i(R_{L(m),x(n)}), V_j(R_{L(m),x(n)}) \rangle \end{pmatrix} \quad (17)$$

-continued $$\underline{\alpha} = [\alpha_{12} \ L \ \alpha_{ij}]^T, \quad \underline{\alpha} \in {}^{\circ N \times 1}$$

$$\underline{p} = [P_{Transfer}(R_{L(1),x(1)}) \ P_{Transfer}(R_{L(1),x(2)}) \ L \ P_{Transfer}(R_{L(m),x(n)})]^T,$$
$$\underline{p} \in {}^{\circ mn \times 1}$$

Equation (15) can be represented using the matrix and vectors in (17) as equation (18) below and $\underline{\alpha}$ is calibrated by least-squares method.

$$\underline{V}\underline{\alpha} = \underline{p} \quad (18)$$

TPM errors are evaluated using leave-one-out cross-validation (LOOCV). The calibration set consists of all the data points except for the one test point. Using multiple sense coil voltage from the test set and calibrated $\alpha_{ij}$, transfer-power is estimated by equation (15). TPM errors are calculated as equation (19)

$$\varepsilon_{mis}(x) = \left| \frac{(P_{Transfer}(x) - \hat{P}_{Transfer}(x))}{P_{Transfer}(x)} \right| \times 100(\%) \quad (19)$$

$$P_{Transfer}(x) = \mathrm{Re}\{V_R(x) I_R^*(x)\},$$

$$\hat{P}_{Transfer}(x) = \sum_{i,j \in S} \alpha_{ij} \langle V_i, V_j \rangle$$

Figure 24:
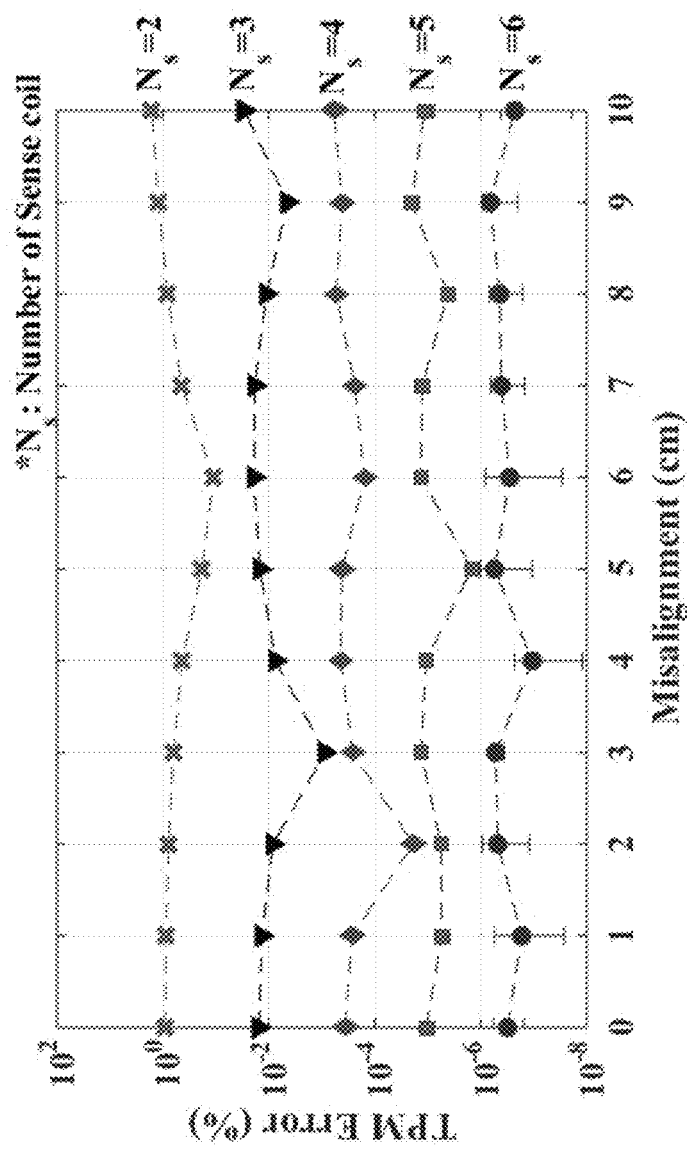
FIG. 24 is a plot illustrating measurement error results as a function of misalignment for transfer power measurement systems having various numbers of sense coils.

All the data can be used as individual test points with the remaining for calibration. FIG. 24 depict plots of the corresponding TPM errors. The results show a nearly constant error along misalignment for each case. When 6-sense coils are used (green-circles), the percentage errors are below $10^{-6}$%. Error bars represent the range of error from the LOOCV test set. Other sense coil error bars are omitted because they are not visible because of the log scaling in the plot.

The dependence of the errors in the estimation of transfer to different numbers of sense coils is investigated. It is expected that more numerous sense coils result in a better estimation because a larger degree of available information is anticipated. FIG. 24 shows that increasing the number of sense coils decrease the errors.

Experiments demonstrate TPM under misalignment. Referring to FIG. 23, a half-bridge topology is used with resonant capacitors in series with the transmitter 2306 and the receiver 2308, respectively. The operating frequency is 91 kHz, which is a surrogate for the 85 kHz specified in SAE TIR J2954 for WPT in EVs. Table 4 shows the variation in configuration and specification for the WPT system and sense coil. Variations of up to 6-sense coils are used in the estimation of transfer-power. An Elsys TraNET 204E data acquisition system at 20 Msample/s, 16-bit resolution, and recording 16 megasamples is used for voltage and current. An Agilent E4980 is used to measure inductances of the 14 AWG copper wire for the transmitter 2306 and the receiver 2308. 42 AWG coaxial cable whose outer diameter is 0.31 mm is used for sense coils 2302; this unusually thin cable is used to minimize unaccounted losses due to eddy currents. The coaxial cable is configured so the outer braid is used as an electrostatic shield.

TABLE 4

Experiment Specifications

| Parameters | Value | Parameters | Value | |
|---|---|---|---|---|
| x coil Self-inductance: $L_T$ | 157.2 μH | Tx and Rx coil Number of turns | 11 | |
| Rx coil Self-inductance: $L_R$ | 157.6 μH | Sense coil Number of turns | 1 | |
| Tx and Rx coil Radius: $r_T$, $r_R$ | 25 cm | $\dfrac{r_i}{r_R}$ | 0.6 | |
| Tx and Rx coil distance: $d_{TR}$ | 20 cm | $\dfrac{d_{Ri}}{r_R}$ | i = 1 | 0.64 |
| | | | 2 | 0.60 |
| | | | 3 | 0.56 |
| | | | 4 | 0.52 |
| | | | 5 | 0.48 |
| | | | 6 | 0.44 |

Figure 25:
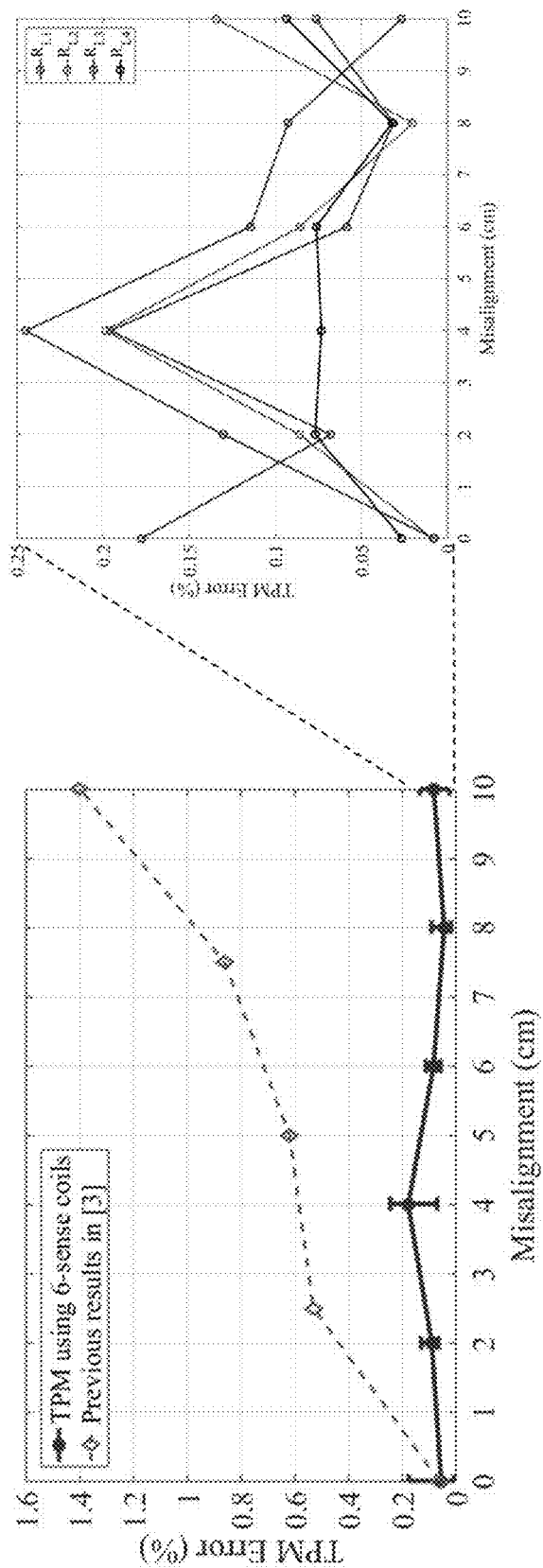
FIG. 25 are plots illustrating experimental results to demonstrate transfer-power measurement error under misalignment in accordance with one example.

FIG. 25 depicts the results for LOOCV on an experimental set for four resistive loads and six misalignment points. The worst error is ±0.12%, which is better than the most stringent ±0.2% standard. The error is decreased by five times than the results in previous research.

An accurate method for transfer-power measurement under misalignment has been disclosed herein, tested through accurate models, and demonstrated through experiments. The present disclosure shows that additional sense coils may be used to provide implicit information about misalignment with a disclosed new algorithm that uses coupling coefficients that are well-approximated by quadratic functions. A quadratic parameterization of these coupling coefficients may be used to minimize errors making the transformation of the sense coil voltages to transfer power appear invariant to misalignment.

The results show accuracy over misalignment that is better than the most stringent of the prevailing standards. Ultimately, enabling users to make decisions with fine-grained information about efficiency and the resulting cost will motivate these stakeholders to make decisions that will encourage an investment in technology and innovation that might include better power conversion and magnetics as well as automatic guidance and sensing for better alignment.

In one aspect, additional sense coils that are coaxial to the transmitter coil reduce misalignment errors from any lateral direction. This, together with a disclosed new power estimation algorithm with quadratic approximations, leads to better accuracy under misalignment. To calculate transfer-power measurement accurately the disclosed calibration model may be followed. The disclosed TPM estimation algorithm using quadratic approximations of coupling coefficients for multiple sense coils also contributes the reduction of errors. The use of precise numerical models and experimental validation confirms the systems and methods disclosed herein.

Described herein are non-contact methods and systems for fair and accurate metering of wireless power transfer. The metering may be useful in connection with electric vehicle charging. A framework for fair and accurate metering of wireless power transfer is described herein. The transfer power provides an accurate and reliable method. The systems may be embedded or otherwise integrated with electric vehicles (e.g., a 2 kW or greater automotive system) and/or electric vehicle charging systems to any desired extent. The disclosed systems and methods may be useful in situations involving varying extents of misalignment.

The power measurement may or may not include computations in the frequency domain by the above-described processors. The processing of the field data may alternatively or additionally be performed in the time domain. The disclosed methods and systems may use information from the fundamental frequency of the wireless power transfer to determine parameters (e.g., for the measurement). The parameters may be valid or otherwise useful for other (e.g., all) frequencies for purposes of the measurement. Alternatively or additionally, the disclosed methods and systems may use information from a plurality of frequencies to determine parameters that may be valid or otherwise useful for other (e.g., all) frequencies for the purposes of the measurement.

While the present invention has been described with reference to specific examples, which are intended to be illustrative only and not to be limiting of the invention, it will be apparent to those of ordinary skill in the art that changes, additions and/or deletions may be made to the disclosed embodiments without departing from the spirit and scope of the invention.

The foregoing description is given for clearness of understanding only, and no unnecessary limitations should be understood therefrom, as modifications within the scope of the invention may be apparent to those having ordinary skill in the art.

What is claimed is:

1. A system for measuring wireless power transfer between a transmitter and a receiver, the system comprising:
   a sensor circuit comprising a a plurality of sensors, each sensor of the plurality of sensors being configured and positioned relative to the transmitter and the receiver to generate sensor data indicative of transfer power propagating from the transmitter to the receiver in connection with the wireless power transfer; and
   a processor coupled to the sensor circuit and configured to determine a power measurement of the transfer power based on the sensor data.

2. The system of claim 1, wherein each sensor of the plurality of sensors is positioned between the transmitter and the receiver.

3. The system of claim 1, wherein the processor is configured to determine the power measurement using pairwise products of the plurality of sensors.

4. The system of claim 1, wherein each sensor of the plurality of sensors includes a respective capacitive sense plate such that the transfer power propagates via an electric field.

5. The system of claim 1, wherein each sensor of the plurality of sensors comprises a sense coil.

6. The system of claim 1, wherein the transfer power propagates via a magnetic field.

7. The system of claim 1, wherein the processor is further configured to determine a misalignment of the transmitter or the receiver, and to correct an estimate of the power measurement based on the misalignment.

8. The system of claim 1, wherein the power measurement is indicative of real power.

9. The system of claim 1, wherein the processor is configured to determine the power measurement via frequency domain computations.

10. The system of claim 1, wherein the processor is configured to determine the power measurement via binning in the frequency domain.

11. The system of claim 1, wherein the processor is configured to determine the power measurement via time domain computations.

12. The system of claim 1, wherein the sensor circuit is configured such that the sensor data disaggregates inefficiencies of the transmitter and inefficiencies of the receiver.

13. The system of claim 1, wherein the sensor circuit is configured such that the sensor data excludes losses from the transmitter and losses from the receiver.

14. The system of claim 1, wherein:
the transfer power involves a field generated by the transmitter and a field generated by the receiver; and
the sensor circuit is configured such that the plurality of sensors resolve the field generated by the transmitter and the field generated by the receiver.

15. A method of measuring wireless power transfer between a transmitter and a receiver, the method comprising:
capturing field data with a plurality of sensors, each sensor of the plurality of sensors being configured and positioned relative to the transmitter and the receiver such that the field data is indicative of transfer power propagating from the transmitter to the receiver in connection with the wireless power transfer; and
determining a power measurement of the transfer power based on the field data.

16. The method of claim 15, further comprising positioning each sensor of the plurality of sensors between the transmitter and the receiver.

17. The method of claim 15, wherein determining the power measurement comprises determining a misalignment of the transmitter or the receiver.

18. The method of claim 17, wherein determining the power measurement further comprises correcting the power measurement based on the misalignment.

19. The method of claim 15, wherein determining the power measurement comprises binning in the frequency domain.

20. The method of claim 15, wherein capturing the field data with the plurality of sensors disaggregates inefficiencies of the transmitter and inefficiencies of the receiver.

21. The method of claim 15, wherein capturing the field data with the plurality of sensors excludes losses from the transmitter and losses from the receiver.

22. The method of claim 15, wherein:
the transfer power involves a field generated by the transmitter and a field generated by the receiver; and
capturing the field data with the plurality of sensors resolves the field generated by the transmitter and the field generated by the receiver.

23. A method of calibrating a wireless power transfer measurement device, the method comprising:
positioning a test receiver relative to a transmitter and the wireless power transfer measurement device;
capturing field data for a load impedance with the wireless power transfer measurement device;
determining a power measurement based on the field data; and
determining a plurality of calibration factors for the wireless power transfer measurement device based on the power measurement.

24. The method of claim 23, wherein capturing the field data comprises varying a load impedance of the test receiver.

25. The method of claim 23, wherein capturing the field data comprises varying a load resistance of the test receiver.

26. The method of claim 23, wherein determining the plurality of calibration factors comprises performing an optimization to minimize measurement error.

27. The method of claim 23, wherein determining the plurality of calibration factors comprises performing a least squares approximation.

28. The method of claim 23, wherein capturing the field data comprises positioning multiple sense coils relative to the transmitter and the wireless power transfer measurement device.

29. The method of claim 28, wherein capturing the field data comprises approximating a misalignment over multiple positions of the multiple sense coils.

30. The method of claim 28, wherein determining the power measurement comprises using pair-wise products of the multiple sense coils.

* * * * *